(12) United States Patent
Hu et al.

(10) Patent No.: US 10,643,522 B2
(45) Date of Patent: May 5, 2020

(54) GATE DRIVING CIRCUIT AND DISPLAY PANEL WITH RESET FUNCTION

(71) Applicant: HannStar Display Corporation, Taipei (TW)

(72) Inventors: Hsien-Tang Hu, Taichung (TW); Hsuan-Chen Liu, Kaohsiung (TW); Chien-Ting Chan, Tainan (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 16/104,959

(22) Filed: Aug. 20, 2018

(65) Prior Publication Data
US 2019/0073939 A1  Mar. 7, 2019

(30) Foreign Application Priority Data
Sep. 7, 2017  (CN) .......................... 2017 1 0801810

(51) Int. Cl.
*G09G 3/20* (2006.01)
*G09G 3/36* (2006.01)
*G09G 3/3266* (2016.01)
*G11C 19/28* (2006.01)

(52) U.S. Cl.
CPC ......... *G09G 3/2092* (2013.01); *G09G 3/3266* (2013.01); *G09G 3/3677* (2013.01); *G11C 19/28* (2013.01); *G09G 2310/0248* (2013.01); *G09G 2310/0286* (2013.01); *G09G 2310/061* (2013.01); *G09G 2330/026* (2013.01); *G09G 2330/06* (2013.01)

(58) Field of Classification Search
CPC ......... G09G 3/3266; G09G 2310/0286; G09G 2330/06; G09G 3/2092; G09G 3/3677; G11C 19/28
See application file for complete search history.

(56) References Cited

U.S. PATENT DOCUMENTS

2015/0102991 A1* 4/2015 Yu ........................ G09G 3/3648
345/100
2015/0279288 A1* 10/2015 Dai ..................... G02F 1/13306
345/690

* cited by examiner

*Primary Examiner* — Xuemei Zheng
(74) *Attorney, Agent, or Firm* — CKC & Partners Co., LLC

(57) ABSTRACT

In a shift register, a pre-charge unit is configured to receive a first input signal and output a pre-charge signal to a first node, a pull-up unit is configured to output a scan signal to a second node, and a pull-down unit is configured to receive a pull-down control signal. The pull-down control signal switches from a disable voltage to an enable voltage before the display panel switches from a non-display status to a display status.

19 Claims, 13 Drawing Sheets

GATE DRIVING CIRCUIT AND DISPLAY PANEL WITH RESET FUNCTION

RELATED APPLICATIONS

This application claims priority to Chinese Application Serial Number 201710801810.0 filed Sep. 7, 2017, which is herein incorporated by reference.

BACKGROUND

Field of Invention

The present invention relates to a gate driving circuit, and more particularly to a gate driving circuit with voltage level reset function and a display panel that has the gate driving circuit.

Description of Related Art

A flat panel display device, such as a liquid crystal display (LCD) device or an organic light-emitting diode (OLED) display device, generally has a lot of shift registers for controlling gray levels of all pixels displayed in the display device at the same time point. On the other hand, the accuracy of signals correspondingly outputted at each time point has to be considered in an electrical circuit design of a shift register for ensuring image display quality of a display device with such shift register. However, if the waveforms of the scan signals outputted by the shift registers output have errors, the display device will be caused to display incorrect image data. In addition, a high-definition (HD) flat panel display device is likely to have an image display problem caused by noise interference on the shift registers.

SUMMARY

An objective of the invention is to provide a gate driving circuit and a display panel with the gate driving circuit, in which the gate driving circuit has voltage level reset function for preventing shift registers from being affected by noise interferences to output abnormal scan signals, thus ensuring that the display panel displays correct images in each frame period.

One aspect of the invention is directed to a gate driving circuit which includes $1^{st}$ to $N^{th}$ stage shift registers, where N is an integer greater than 1. The $1^{st}$ to $N^{th}$ stage shift registers are configured to respectively provide $1^{st}$ to $N^{th}$ stage scan signals to $1^{st}$ to $N^{th}$ gate lines of a display panel of a display device. An $i^{th}$ stage shift register of the $1^{st}$ to $N^{th}$ stage shift registers includes a pre-charge unit, a pull-up unit and a pull-down unit, where i is an integer that is greater than or equal to 1 and is smaller or equal to N. The pre-charge unit is coupled to a first node and is configured to receive a first input signal and output a pre-charge signal to the first node. The pull-up unit is coupled to the first node and a second node and outputs an $i^{th}$ stage scan signal of the $1^{st}$ to $N^{th}$ stage scan signals to the second node. The pull-down unit is coupled to the first node and the second node and receives a pull-down control signal. The pull-down control signal switches from a disable voltage to an enable voltage before the display panel switches from a non-display status to a display status.

In one embodiment of the invention, the $i^{th}$ stage shift register further includes another pull-down unit. The pull-down unit is configured to further receive another pull-down control signal. The another pull-down unit is coupled to the first node and the second node and is configured to receive the pull-down control signal and the another pull-down control signal.

In one embodiment of the invention, the first input signal received by the $1^{st}$ stage shift register switches from a low voltage level to a high voltage level at a first time point, and the pull-down control signal switches from the disable voltage to the enable voltage before the first time point.

In one embodiment of the invention, the first input signal received by the $1^{st}$ stage shift register is a starting signal.

In one embodiment of the invention, the pull-down control signal switches from the disable voltage to the enable voltage before the display panel displays a first frame after the display device leaves a sleep mode.

In one embodiment of the invention, the pull-down control signal switches from the disable voltage to the enable voltage before the display panel displays a first frame after the display panel is powered on.

In one embodiment of the invention, the pull-down control signal keeps at the enable voltage during a time duration before the display panel switches from the non-display status to the display status, and the time duration is greater than or equal to 50 milliseconds and is less than or equal to 1 second.

In one embodiment of the invention, the pull-down control signal and the another pull-down control signal are phase inverted during a time duration before the display panel switches from the non-display status to the display status, and the time duration is greater than or equal to 50 milliseconds and is less than or equal to 1 second.

In one embodiment of the invention, the pre-charge unit includes a first transistor and a second transistor. A control terminal of the first transistor is configured to receive the first input signal, a first terminal of the first transistor is configured to receive a forward input signal, and a second terminal of the first transistor is coupled to the first node. A control terminal of the second transistor is configured to receive a second input signal, a first terminal of the second transistor is configured to receive a backward input signal, and a second terminal of the second transistor is coupled to the second terminal of the first transistor.

In one embodiment of the invention, the pull-up unit includes a third transistor and a capacitor. A control terminal of the third transistor is coupled to the first node and is configured to receive the pre-charge signal, a first terminal of the third transistor is configured to receive a clock signal, and a second terminal of the third transistor is coupled to the second node and is configured to output the scan signal. A first terminal of the capacitor is coupled to the control terminal of the third transistor, and a second terminal of the capacitor is coupled to the second terminal of the third transistor.

In one embodiment of the invention, the pull-down unit includes a fourth transistor, a fifth transistor, a sixth transistor, a seventh transistor and an eighth transistor. A control terminal and a first terminal of the fourth transistor are configured to receive the pull-down control signal. A control terminal of the fifth transistor is configured to receive the another pull-down control signal, a first terminal of the fifth transistor is coupled to a reference voltage, and a second terminal of the fifth transistor is coupled to the second terminal of the fourth transistor. A control terminal of the sixth transistor is coupled to the first node, a first terminal of the sixth transistor is coupled to the reference voltage, and a second terminal of the sixth transistor is coupled to the second terminal of the fourth transistor. A control terminal of the seventh transistor is coupled to the second terminal of the sixth transistor, a first terminal of the seventh transistor is coupled to the reference voltage, and a second terminal of the seventh transistor is coupled to the first node. A control terminal of the eighth transistor is coupled to the second terminal of the sixth transistor, a first terminal of the eighth transistor is coupled to the reference voltage, and a second terminal of the eighth transistor is coupled to the second node.

In one embodiment of the invention, the another pull-down unit includes a ninth transistor, a tenth transistor, an eleventh transistor, a twelfth transistor and a thirteenth transistor. A control terminal and a first terminal of the ninth transistor are configured to receive the another pull-down control signal. A control terminal of the tenth transistor is configured to receive the pull-down control signal, a first terminal of the tenth transistor is coupled to the reference voltage, and a second terminal of the tenth transistor is coupled to the second terminal of the ninth transistor. A control terminal of the eleventh transistor is coupled to the first node, a first terminal of the eleventh transistor is coupled to the reference voltage, and a second terminal of the eleventh transistor is coupled to the second terminal of the ninth transistor. A control terminal of the twelfth transistor is coupled to the second terminal of the eleventh transistor, a first terminal of the twelfth transistor is coupled to the reference voltage, and a second terminal of the twelfth transistor is coupled to the first node. A control terminal of the thirteenth transistor is coupled to the second terminal of the eleventh transistor, a first terminal of the thirteenth transistor is coupled to the reference voltage, and a second terminal of the thirteenth transistor is coupled to the second node.

Another aspect of the invention is directed to a gate driving circuit which includes $1^{st}$ to $N^{th}$ stage shift registers. The $1^{st}$ to $N^{th}$ stage shift registers are configured to respectively provide $1^{St}$ to $N^{th}$ stage scan signals to $1^{st}$ to $N^{th}$ gate lines of a display panel, where N is an integer greater than 1. An $i^{th}$ stage shift register of the $1^{st}$ to $N^{th}$ stage shift registers includes a pre-charge unit, a pull-up unit, a first pull-down unit and a second pull-down unit, where i is an integer that is greater than or equal to 1 and is smaller than or equal to N. The pre-charge unit is coupled to a first node and is configured to receive a first input signal and output a pre-charge signal to the first node. The pull-up unit is coupled to the first node and a second node and is configured to output an $i^{th}$ stage scan signal of the $1^{st}$ to $N^{th}$ stage scan signals to the second node. The first pull-down unit is coupled to the first node and the second node and is configured to receive a first pull-down control signal and a second pull-down control signal. The second pull-down unit is coupled to the first node and the second node and is configured to receive the first pull-down control signal and the second pull-down control signal. At least one of the first pull-down control signal and the second pull-down control signal switches from a disable voltage to an enable voltage before the display panel switches from a non-display status to a display status.

In one embodiment of the invention, the first pull-down control signal and the second pull-down control signal are phase-inverted during a time duration before the display panel switches from the non-display status to the display status.

In one embodiment of the invention, the time duration is greater than or equal to 50 milliseconds and is less than or equal to 1 second.

Yet another aspect of the invention is directed to a display panel which has a display area and a non-display area and includes a substrate, gate lines, data lines and $1^{st}$ to $N^{th}$ stage shift registers. The gate lines and the data lines are disposed on the substrate. The gate lines have $1^{st}$ to $N^{th}$ gate lines, where N is an integer greater than 1. The $1^{st}$ to $N^{th}$ stage shift registers are disposed on the substrate and in the non-display area and are configured to respectively provide $1^{st}$ to $N^{th}$ stage scan signals to the $1^{st}$ to $N^{th}$ gate lines. An $i^{th}$ stage shift register of the $1^{st}$ to $N^{th}$ stage shift registers includes a pre-charge unit, a pull-up unit and a pull-down unit, where i is an integer that is greater than or equal to 1 and is smaller than or equal to N. The pre-charge unit is coupled to a first node and is configured to receive a first input signal and output a pre-charge signal to the first node. The pull-up unit is coupled to the first node and a second node and is configured to output an $i^{th}$ stage scan signal of the $1^{st}$ to $N^{th}$ stage scan signals to the second node. The pull-down unit is coupled to the first node the second node and is configured to receive a pull-down control signal. The pull-down control signal switches from a disable voltage to an enable voltage before the display panel switches from a non-display status to a display status.

In one embodiment of the invention, the $1^{st}$ to $N^{th}$ stage shift registers are a gate driver on array (GOA).

In one embodiment of the invention, the $i^{th}$ stage shift register further includes another pull-down unit. The pull-down unit is coupled to the first node and the second node and is configured to further receive another pull-down control signal. The another pull-down unit is coupled to the first node and the second node and is configured to receive the pull-down control signal and the another pull-down control signal.

In one embodiment of the invention, the pull-down control signal and the another pull-down control signal are phase-inverted during a time duration before the display panel switches from the non-display status to the display status.

In one embodiment of the invention, the time duration is greater than or equal to 50 milliseconds and is less than or equal to 1 second.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

It will be understood that, although the terms "first," "second," and "third" may be used herein to describe various elements, components, areas, layers and/or portions, these elements, components, areas, layers and/or portions, should not be limited by these terms. These terms are only used to distinguish elements, components, areas, layers and/or portions.

Regarding the term "coupled" used in the following description, it may be used to indicate that two or more elements are in direct physical or electrical contact with each other, or may also mean that two or more elements may not be in direct contact with each other. "Coupled" may still be used to indicate that two or more elements cooperate or interact with each other.

Figure 1:
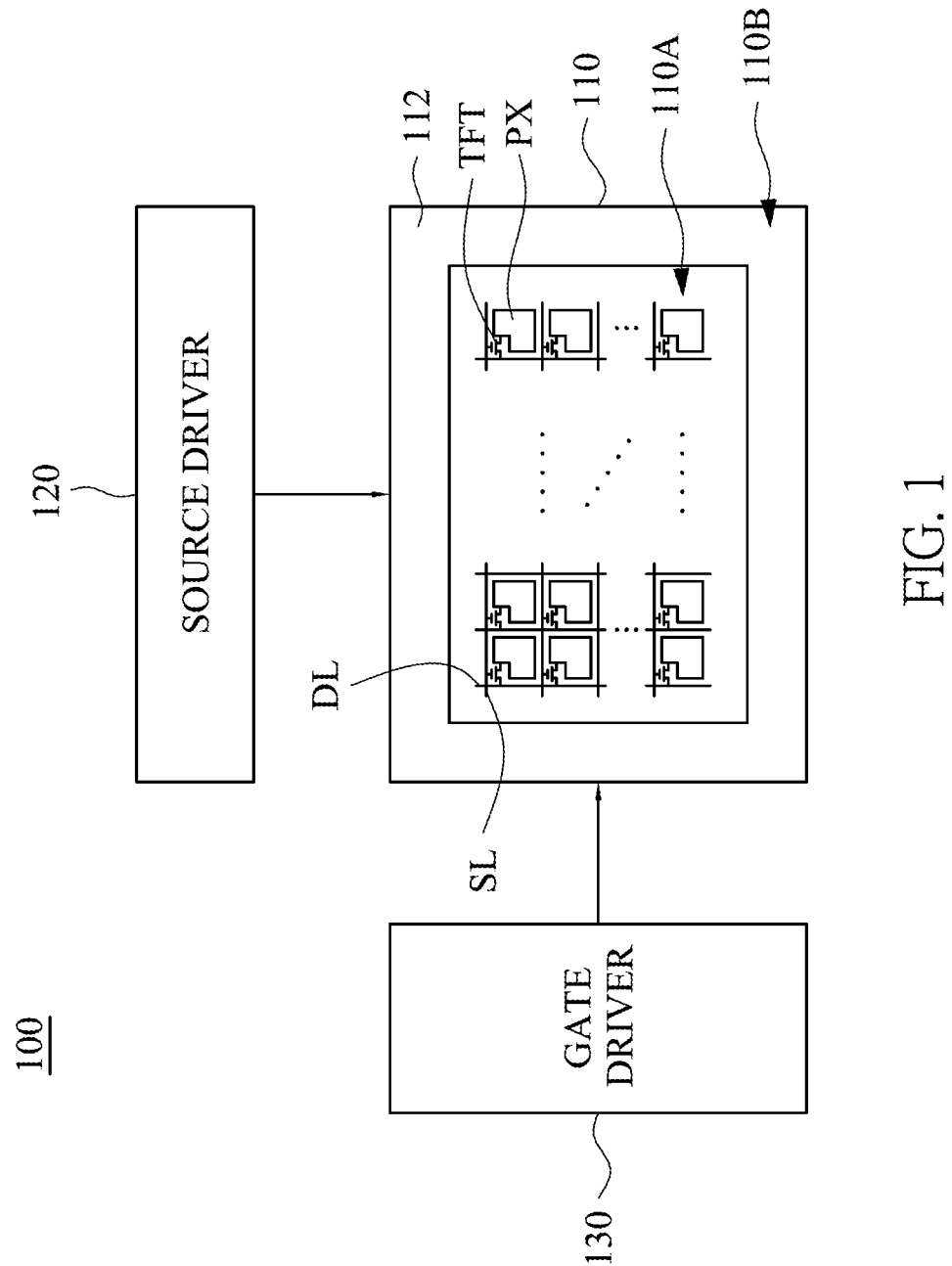
FIG. 1 is a schematic diagram of a display device in accordance with some embodiments of the invention.

Referring to FIG. 1, FIG. 1 is a schematic diagram of a display device 100 in accordance with some embodiments of the invention. The display device 100 includes a display panel 110, a source driver 120 and a gate driver 130. The display panel 110 may be, for example, a liquid crystal display (LCD) apparatus of twisted nematic (TN) mode, in-plane switching (IPS) mode, fringe-field switching (FFS) mode, vertical alignment (VA) mode or other different modes, or an organic light-emitting diode (OLED) panel. The source driver 120 is electrically connected to the display panel 110 and is configured to convert image data into source driving signals and transmit the source driving signals to the display panel 110. The gate driver 130 is configured to generate and transmit gate driving signals to the display panel 110. The display panel 110 has a display region 110A and a non-display region 110B. In the display region 110A, data lines DL, gate lines SL and pixels PX are formed on the substrate 112, and such pixels PX collectively display an image by the driving of the source driving signals and the gate driving signals. In the non-display region 110B, wirings (not shown) are respectively coupled to the source driver 120 and the gate driver 130 and are respectively coupled to the data lines DL and the gate lines SL in the display region 110A, so as to respectively send the source driving signals and the gate driving signals to thin film transistors TFT of the corresponding pixels PX, such that the pixels PX display corresponding gray levels in a particular time under the on-off switch control of the thin film transistors TFT.

Figure 2:
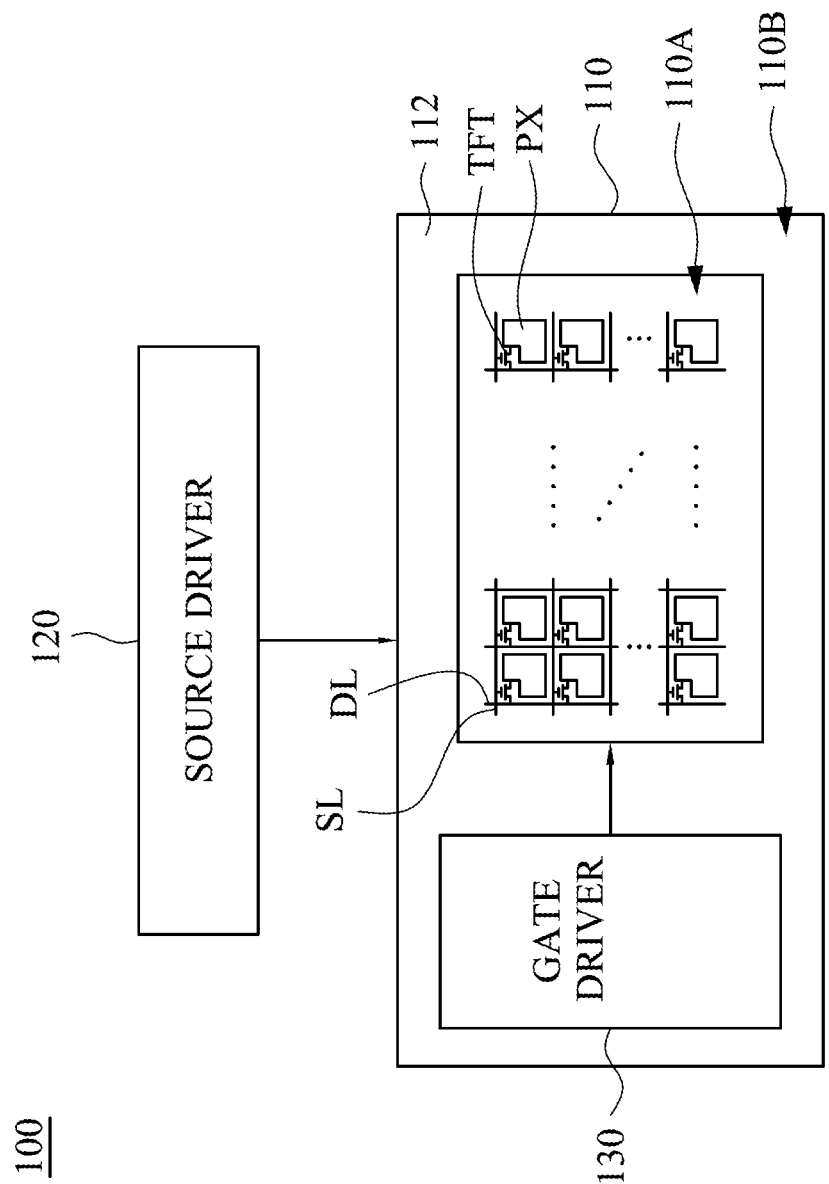
FIG. 2 is a schematic diagram of a display device in accordance with some embodiments of the invention.

The source deriver 120 and/or the gate driver 130 in FIG. 1 may be integrated in the display panel 110. As shown in FIG. 2, the display device 100 of the invention may be a system on glass (SOG) panel, in which the gate driver 130 is formed in the non-display region 110B of the display panel 110. As such, the electrical components in the gate driver 130 and the display region 110A may be formed simultaneously by the same process or processes. For example, the TFTs of the gate driving circuit in the gate driver 130 and the TFTs of the pixels in the display region 110A of the display panel 110 may be formed simultaneously by the same process or processes. In other embodiments, the source driver 120 may also be formed in the non-display region 110B of the display panel 110, and the electrical components and wirings in the display panel 110, the source driver 120 and the gate driver 130 may be formed simultaneously by the same process or processes.

Figure 3:
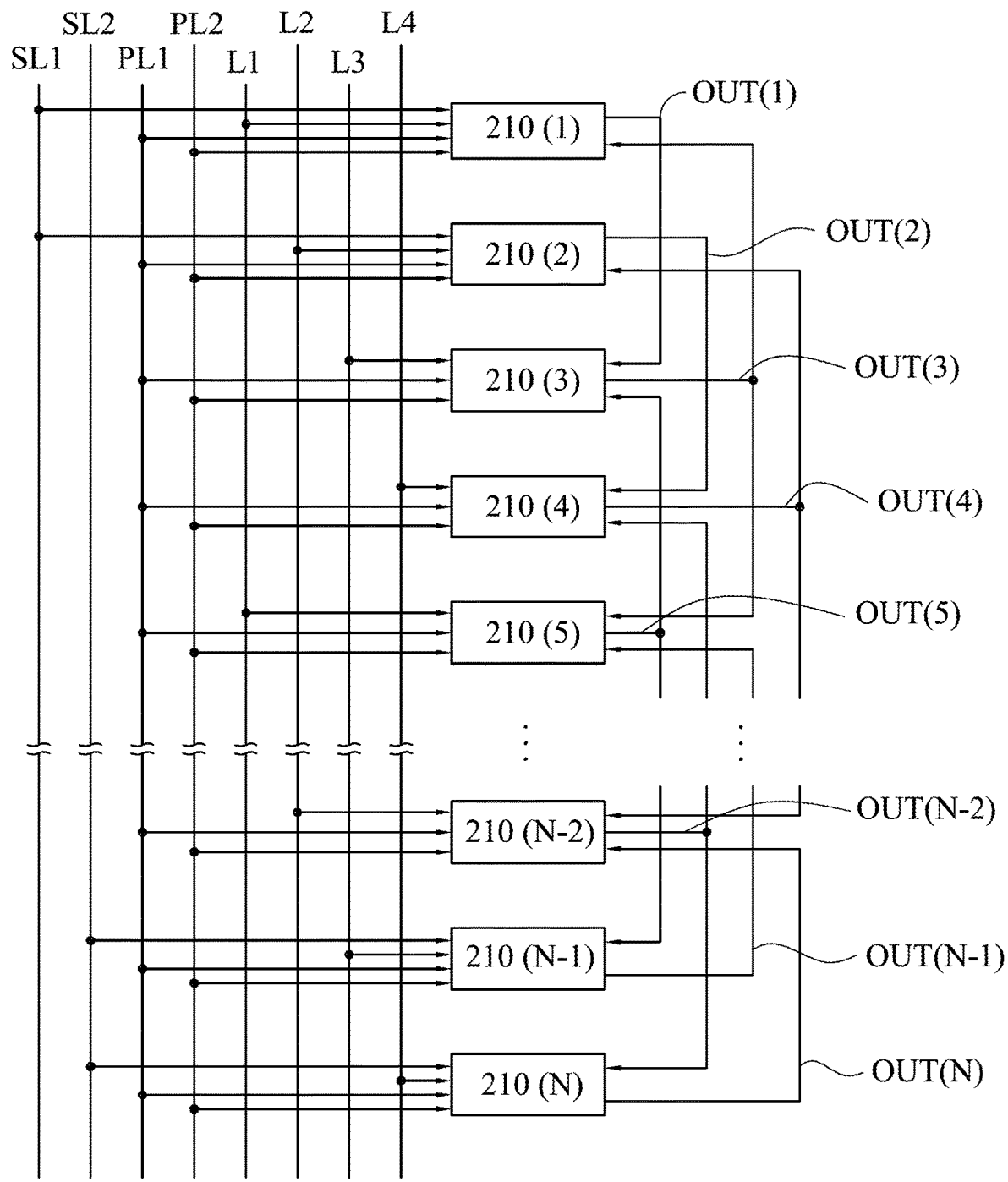
FIG. 3 is a schematic diagram of a gate driving circuit in accordance with some embodiments of the invention.

Referring to FIG. 3, which illustrates a schematic diagram of a gate driving circuit 200 in accordance with a first embodiment of the invention. The gate driving circuit 200 may be applied to the display device 100 in FIG. 1 or FIG. 2, or another similar display device. In the following, the gate driving circuit 200 applied to the display device 100 in FIG. 2 is exemplified for description. The gate driving circuit 200 is a part of the gate driver 130 and includes clock signal lines L1-L4, a starting signal line SL1, an ending signal line SL2, pull-down control signal lines PL1 and PL2 and $1^{st}$ to $N^{th}$ stage shift registers 210(1)-210(N), where N is an integer greater than or equal to 5. The clock signals lines L1-L4 respectively provide clock signals C1-C4 to the corresponding shift registers 210(1)-210(N). The $1^{st}$ to $N^{th}$ stage shift registers 210(1)-210(N) are a Gate Driver on Array (GOA) circuit structure. In some embodiments, as shown in FIG. 3, N is a multiple of 4, the clock signal line L1 provides the clock signal C1 to the $1^{st}$ stage shift register 210(1), the $5^{th}$ stage shift register 210(5), . . . , and the $(N-3)^{th}$ stage shift register 210(N-3), the clock signal line L2 provides the clock signal C2 to the $2^{nd}$ stage shift register 210(2), the $6^{th}$ stage shift register 210(6), . . . , and the $(N-2)^{th}$ stage shift register 210(N-2), the clock signal line L3 provides the clock signal C3 to the $3^{rd}$ stage shift register 210(3), the r stage shift register 210(7), . . . , and the $(N-1)^{th}$ stage shift register 210(N-1), and the clock signal line L4 provides the clock signal C4 to the $4^{th}$ stage shift register 210(4), the $8^{th}$ stage shift register 210(8), . . . , and the $N^{th}$ stage shift register 210(N). In addition, the starting signal line SL1 provides a starting signal STV1 to the $1^{st}$ and $2^{nd}$ stage shift registers 210(1) and 210(2), and the ending signal line SL2 provides an ending signal STV2 to the $(N-1)^{th}$ and $N^{th}$ stage shift registers 210(N-1) and 210(N). The pull-down control signal lines PL1 and PL2 respectively provide pull-down control signals GPW1 and GPW2 to the $1^{st}$ to $N^{th}$ stage shift registers 210(1)-210(N). The clock signal lines L1-L4, the starting signal line SL1, the ending signal line SL2 and the pull-down control signal lines PL1 and PL2 may be coupled to one or more chips. That is, the clock signals C1-C4, the starting signal STV1, the ending signal STV2 and the pull-down control signals GPW1 and GPW2 may be provided by the chip(s), such as a driver chip and/or a controller chip, but are not limited thereto.

The $1^{st}$ to $N^{th}$ stage shift registers 210(1)-210(N) respectively provide $1^{st}$ to $N^{th}$ stage scan signals OUT(1)-OUT(N). The $1^{st}$ to $N^{th}$ stage scan signals OUT(1)-OUT(N) are sequentially outputted to $1^{st}$ to $N^{th}$ gate lines of the display panel 110. The $1^{st}$ and $2^{nd}$ stage scan signals OUT(1) and OUT(2) are respectively inputted to the $3^{rd}$ and $4^{th}$ stage shift registers 210(3) and 210(4), the $(N-1)^{th}$ and $N^{th}$ scan signals OUT(N-1) and OUT(N) are respectively inputted to the $(N-3)^{th}$ and $(N-2)^{th}$ stage shift registers 210(N-3) and 210(N-2), and each of the $3^{rd}$ to $(N-2)^{th}$ stage scan signals OUT(3)-OUT(N-2) is inputted to the shift registers previous two stage of shift register thereto and next two stage of shift register thereto. For illustration, the $3^{rd}$ stage scan signal OUT(3) is inputted to the $1^{st}$ and $5^{th}$ shift registers 210(1) and 210(5).

Figure 4:
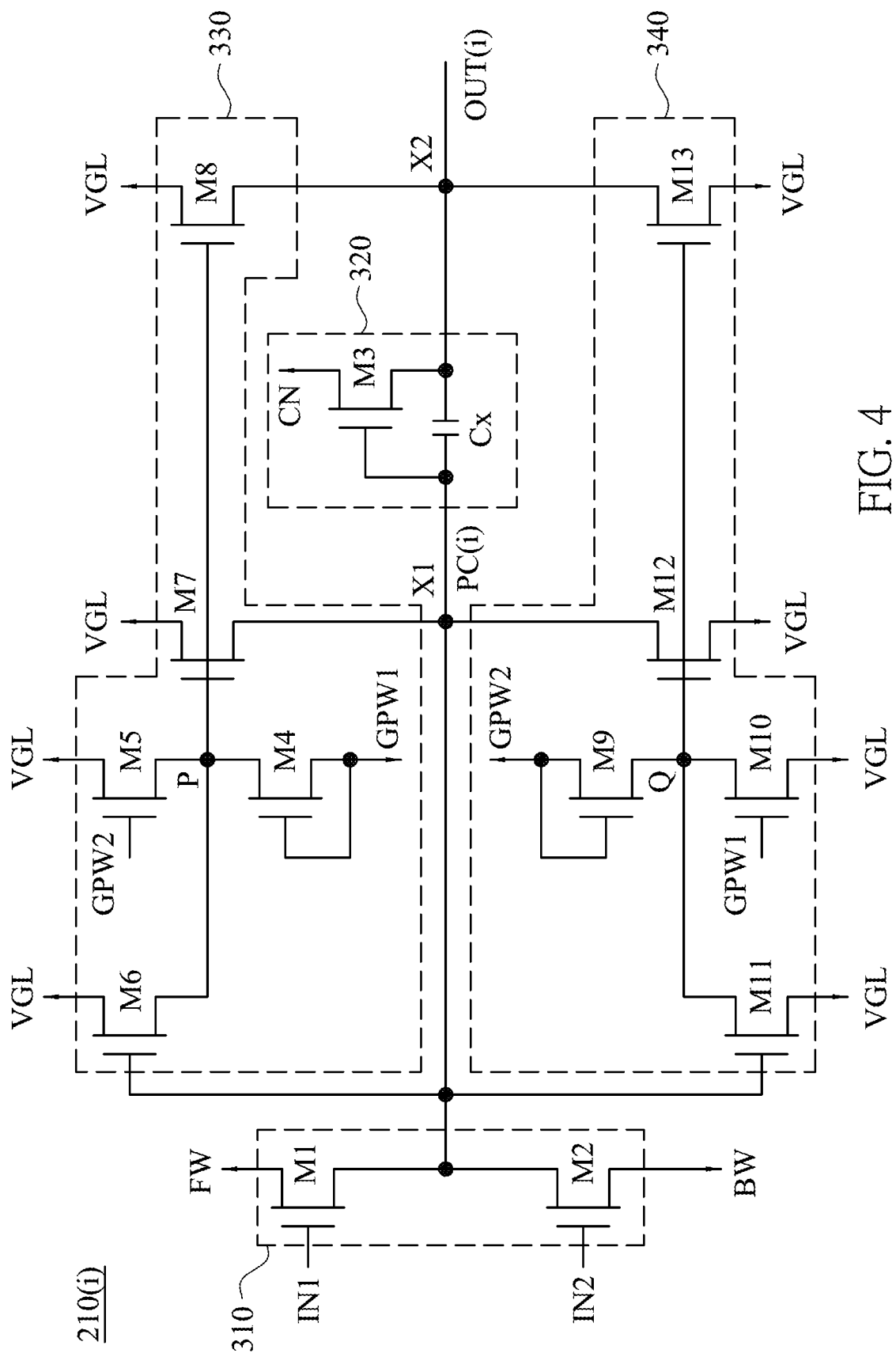
FIG. 4 illustrates an equivalent circuit diagram of a shift register in FIG. 3.

FIG. 4 illustrates an equivalent circuit diagram in accordance with the $i^{th}$ stage shift register 210(i) of the gate driving circuit 200 in FIG. 3, where i is an integer from 1 to N. As shown in FIG. 4, the $i^{th}$ stage shift register 210(i) includes a pre-charge unit 310, a pull-up unit 320, a first pull-down unit 330 and a second pull-down unit 340, in which terminals of the pre-charge unit 310, the pull-up unit 320, the first pull-down unit 330 and the second pull-down unit 340 are coupled to the node X1 (which corresponds to the pre-charge signal PC(i)), and the other terminals of the pull-up unit 320, the first pull-down unit 330 and the second pull-down unit 340 are coupled to the node X2 (which corresponds to the $i^{th}$ stage scan signal OUT(i)), and the node X2 is coupled to a corresponding gate line (not shown). The nodes X1 and X2 are also respectively called a first node and a second node.

The pre-charge unit 310 receives input signals IN1 and IN2 to output the pre-charge signal PC(i) to the node X1 based on the input signals IN1 and IN2. The pre-charge unit 310 includes transistors M1 and M2. In the embodiments, the gate driving circuit 200 is a driving circuit of bidirectional scanning. In each of the shift registers 210(1)-210(N), the control terminal of the transistor M1 receives the input signal IN1, the first terminal of the transistor M1 receives a forward input signal FW, and the second terminal of the transistor M1 is coupled to the node X1; the control terminal of the transistor M2 receives the input signal IN2, the first terminal of the transistor M2 receives a backward input signal BW, and the second terminal of the transistor M2 is coupled to the second terminal of the transistor M1. In the context, the terms "control terminal", "first terminal" and "second terminal" of a transistor are respectively the gate, the source and the drain of the transistor, or are respectively the gate, the drain and the source of the transistor.

If the shift register 210(i) is the $1^{st}$ stage shift register 210(1) or the $2^{nd}$ stage shift register 210(2) (i.e. i is 1 or 2), the input signal IN1 is the starting signal STV1, and the input signal IN2 is the scan signal OUT(i+2) outputted by the $(i+2)^{th}$ stage shift register 210(i+2) (i.e. the $3^{rd}$ stage scan signal OUT(3) or the $4^{th}$ stage scan signal OUT(4)). If the shift register 210(i) is any one of the $3^{rd}$ stage shift register 210(3) to the $(N-2)^{th}$ stage shift register 210(N-2) (i.e. i is any integer from 3 to N-2), the input signals IN1 and IN2 are respectively the scan signal OUT(i-2) outputted by the $(i-2)^{th}$ stage shift register 210(i-2) and the scan signal OUT(i+2) outputted by the $(i+2)^{th}$ stage shift register 210(i+2). If the shift register 210(i) is the $(N-1)^{th}$ stage shift register 210(N-1) or the $N^{th}$ stage shift register 210(N) (i.e. i is N-1 or N), the input signal IN1 is the scan signal OUT(i-2) outputted by the $(i-2)^{th}$ stage shift register 210(i-2), and the input signal IN2 is the ending signal STV2.

It is noted that, when the gate driving circuit 200 is operated in a forward scanning mode, i.e. the forward input signal FW is at the high voltage level and the backward input signal BW is at the low voltage level, STV1 is a starting signal, while STV2 is an ending signal; when the gate driving circuit 200 is operated in a backward scanning mode, i.e., the forward input signal FW is at the low voltage level and the backward input signal BW is at the high voltage level, STV2 is a starting signal, while STV1 is an ending signal, but are not limited thereto. In the embodiments of this application, the forward scanning mode is exemplified, i.e. STV1 is a starting signal while STV2 is an ending signal; the embodiments for the backward scanning mode may be analogized from above and will not be repeated herein.

The pull-up unit 320 is coupled to the pre-charge unit 310 and is configured to receive the pre-charge signal PC(i) and a clock signal CN to output the scan signal OUT(i) to the node X2 based on the pre-charge signal PC(i) and the clock signal CN, in which the clock signal CN is one of the clock signals C1-C4. In the embodiments in which N is a multiple of 4, if i is 1, 5, ... or (N-3), the clock signal CN is the clock signal C1; if i is 2, 6, ... or (N-2), the clock signal CN is the clock signal C2; if i is 3, 7, ... or (N-1), the clock signal CN is the clock signal C3; if i is 4, 8, ... or N, the clock signal CN is the clock signal C4. The pull-up unit 320 includes a transistor M3 and a capacitor Cx. The control terminal of the transistor M3 receives the pre-charge signal PC(i), the first terminal of the transistor M3 receives the clock signal CN, and the second terminal of the transistor M3 outputs the scan signal OUT(i). The two terminals of the capacitor Cx are respectively coupled to the control terminal and the second terminal of the transistor M3.

The first pull-down unit 330 is coupled to the pre-charge unit 310 and the pull-up unit 320 and receives the pre-charge signal PC(i) and the pull-down control signals GPW1 (also called a first pull-down control signal) and GPW2 (also called a second pull-down control signal) to control whether to pull down the scan signal OUT(i) to the reference voltage level and then keep the scan signal OUT(i) at the reference voltage level based on the pre-charge signal PC(i) and the pull-down control signals GPW1 and GPW2. As shown in FIG. 4, the reference voltage in the embodiments is a gate low voltage (VGL), but is not limited thereto. In each frame period, the pull-down control signals GPW1 and GPW2 are phase-inverted from each other, i.e., one of the pull-down control signals GPW1 and GPW2 is a high voltage level, while the other of the pull-down control signals GPW1 and GPW2 is a low voltage level. The first pull-down unit 330 includes transistors M4-M8. The control terminal and the first terminal of the transistor M4 receive the pull-down control signal GPW1. The control terminal of the transistor M5 receives the pull-down control signal GPW2, the first terminal of the transistor M5 is coupled to the reference voltage level VGL, and the second terminal of the transistor M5 is coupled to the second terminal of the transistor M4. The second terminals of the transistors M4 and M5 are coupled to a node P. The control terminal of the transistor M6 is coupled to the node X1, the first terminal of the transistor M6 is coupled to the reference voltage level VGL, and the second terminal of the transistor M6 is coupled to the second terminal of the transistor M4. The control terminal of the transistor M7 is coupled to the second terminal of the transistor M6, the first terminal of the transistor M7 receives the reference voltage level VGL, and the second terminal of the transistor M7 is coupled to the node X1. The control terminal of the transistor M8 is coupled to the second terminal of the transistor M6, the first terminal of the transistor M8 receives the reference voltage level VGL, and the second terminal of the transistor M8 is coupled to the node X2. After the shift register 210(i) outputs the scan signal OUT(i) to activate the corresponding row of pixels (i.e. the voltage level of the scan signal OUT(i) rises to the high voltage level and then falls to the low voltage level after keeping at the high voltage level in a period of time), the voltage level of the node X1 falls to the low voltage level from the high voltage level, and the first pull-down unit 330 starts working. When the voltage levels of the pull-down control signals GPW1 and GPW2 are respectively the low voltage level and the high voltage level, the node P is in a low voltage level status, such that the transistors M7 and M8 are turned-off; when the voltage levels of the pull-down control signals GPW1 and GPW2 are respectively the high voltage level and the low voltage level, the node P is in a high voltage level status, such that the transistors M7 and M8 are turned on, so as to set the voltage levels of the nodes X1 and X2 to the reference voltage level VGL. In a frame period, after the shift register 210(i) outputs the scan signal OUT(i) to activate the corresponding row of pixels, i.e., after the scan signal OUT(i) rises to the high voltage level and then falls to the low voltage level after keeping at the high voltage level in a period of time, if a noise signal is coupled to the node X1 and/or the node X2 to generate a ripple at the node X1 and/or the node X2, the turned-on transistors M7 and M8 will pull down the nodes X1 and X2 to be at the low voltage level (e.g. the reference voltage level VGL), i.e., pulling down the scan signal OUT(i) to and keep the scan signal OUT(i) at the low voltage level without interfering the scan signal OUT(i) by noise.

The second pull-down unit 340 is coupled to the pre-charge unit 310 and the pull-up unit 320 and receives the pre-charge signal PC(i) and the pull-down control signals GPW1 and GPW2 to control whether to pull down the scan signal OUT(i) to the reference voltage level VGL and then keep the scan signal OUT(i) at the reference voltage level VGL based on the pre-charge signal PC(i) and the pull-down control signals GPW1 and GPW2. The second pull-down unit 340 includes transistors M9-M13. The control terminal and the first terminal of the transistor M9 receive the pull-down control signal GPW2. The control terminal of the transistor M10 receives the pull-down control signal GPW1, the first terminal of the transistor M10 is coupled to the reference voltage level VGL, and the second terminal of the transistor M10 is coupled to the second terminal of the transistor M9. The second terminals of the transistors M9 and M10 are coupled to a node Q. The control terminal of the transistor M11 is coupled to the node X1, the first terminal of the transistor M11 is coupled to the reference voltage level VGL, and the second terminal of the transistor M11 is coupled to the second terminal of the transistor M9. The control terminal of the transistor M12 is coupled to the second terminal of the transistor M11, the first terminal of the transistor M12 receives the reference voltage level VGL, and the second terminal of the transistor M12 is coupled to the node X1. The control terminal of the transistor M13 is coupled to the second terminal of the transistor M11, the first terminal of the transistor M13 receives the reference voltage level VGL, and the second terminal of the transistor M13 is coupled to the node X2. After the shift register 210(i) outputs the scan signal OUT(i) to activate the corresponding column of pixels (i.e. the voltage level of the scan signal OUT(i) rises to the high voltage level and then falls to the low voltage level after keeping at the high voltage level in a period of time), the voltage level of the node X1 falls to the low voltage level from the high voltage level, and the second pull-down unit 340 starts working. When the voltage levels of the pull-down control signals GPW1 and GPW2 are respectively the low voltage level and the high voltage level, the node Q is in a high voltage level status, such that the transistors M12 and M13 are turned on, so as to set the voltage levels of the nodes X1 and X2 to the reference voltage level VGL. When the voltage levels of the pull-down control signals GPW1 and GPW2 are respectively the high voltage level and the low voltage level, the node Q is in a low voltage level status, such that the transistors M12 and M13 are turned off. In a frame period, after the shift register 210(i) outputs the scan signal OUT(i) to activate the corresponding row of pixels, i.e., after the scan signal OUT(i) rises to the high voltage level and then falls to the low voltage level after keeping at the high voltage level in a period of time, if a noise signal is coupled to the node X1 and/or the node X2, the turned-on transistors M7 and M8 will pull down the nodes X1 and X2 to be at the low voltage level, i.e., pulling down the scan signal OUT(i) to and keep the scan signal OUT(i) at the low voltage level without interfering the scan signal OUT(i) by noise.

In FIG. 4, the transistors M1-M13 may be amorphous silicon TFTs, low temperature polysilicon (LTPS) TFTs, indium gallium zinc oxide (IGZO) TFTs, or other suitable TFTs.

It is noted that, when displaying, the pull-down control signals GPW1 and GPW2 are periodic signals, and the waveforms of the pull-down control signals GPW1 and GPW2 are phase-inverted and have high voltage level and low voltage level transitions, i.e., one of the pull-down control signals GPW1 and GPW2 is the high voltage level, while the other of the pull-down control signals GPW1 and GPW2 is the low voltage level, so as to prevent the transistors in the first pull-down unit 330 and the second pull-down unit 340 from a threshold voltage shift due to long-time turning on operation to result in failure of the first pull-down unit 330 and the second pull-down unit 340.

Figure 5:
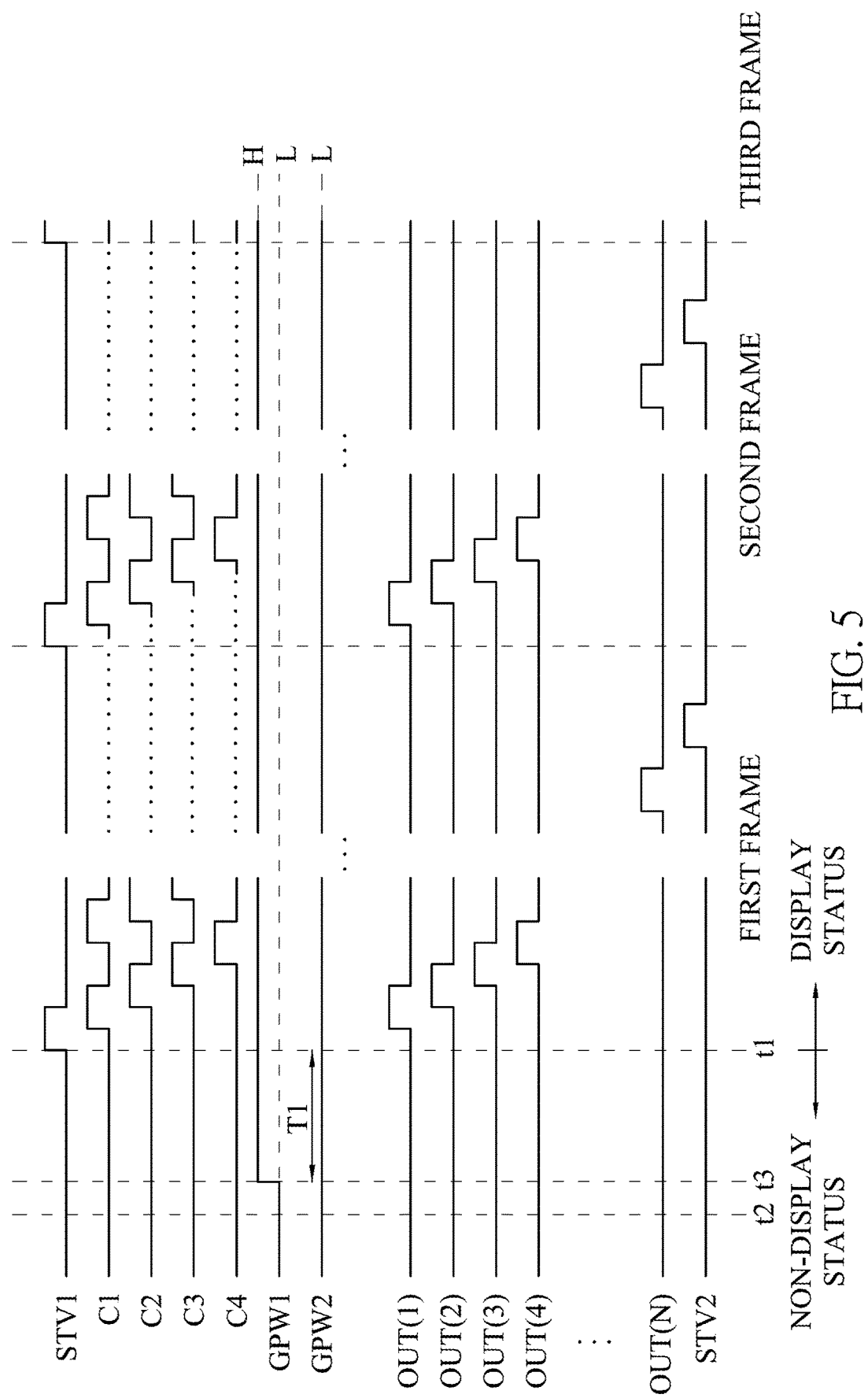
FIG. 5 is an exemplary time sequential diagram in accordance with the gate driving circuit in FIG. 3.

FIG. 5 is an exemplary time sequential diagram in accordance with the gate driving circuit 200 in FIG. 3. As shown in FIG. 5, before the display panel switches form a non-display status to the display status, i.e., the starting signal STV1 rises form the low voltage level to the high voltage level in the first frame period, the pull-down control signal GPW1 rises from the low voltage level L to the high voltage level H, and the pull-down control signal GPW2 is at the low voltage level L, in order to turn on the transistors M7 and M8 in the first pull-down unit 330 to set the voltage levels of the nodes X1 and X2 of the shift registers 210(1)-210(N) to the low voltage level. The pull-down control signal GPW1 keeps at the high voltage level H and the pull-down control signal GPW2 keeps at the low voltage level L during the time duration T1. In other words, the pull-down control signals GPW1 and GPW2 are phase-inverted during the time duration T1. Then, after the display panel enters the display status, the pull-down control signals GPW1 and GPW2 are phase-inverted, i.e., one of the pull-down control signals GPW1 and GPW2 is at the high voltage level while the other is at the low voltage level. As shown in FIG. 5, the time point at which the starting signal STV1 switches from the low voltage level to the high voltage level in the first frame period is a first time point t1; in the non-display status and before the first time point t1 shown in FIG. 5, e.g. at a second time point t2, the pull-down control signals GPW1 and GPW2 are all the low voltage level L. At a third time point t3 (between the first time point t1 and the second time point t2) shown in FIG. 5, the pull-down control signal GPW1 switches from the low voltage level L to the high voltage level H, and the pull-down control signal GPW2 is at the low voltage level L. The time duration T1 between the predetermined time point (e.g. the third time point t3) at which the pull-down control signal GPW1 rises from the low voltage level L to the high voltage level H and the time point (e.g. the first time point t1) at which the display panel switches from the non-display status to the display status is greater than or equal to 50 milliseconds and is less than or equal to 1 second, such that the voltage levels of the nodes X1 and X2 of the shift registers 210(1)-210(N) have enough time to be set to the low voltage level. Furthermore, in some embodiments, the time duration T1 is greater than or equal to 100 milliseconds and is less than or equal to 200 milliseconds, and preferably about 100 milliseconds. Then, after the display panel switches form the non-display status to the display status, the pull-down control signals GPW1 and GPW2 are respectively at the high voltage level and the low voltage level, and the gate driving circuit 200 starts outputting the $1^{st}$ to $N^{th}$ stage scan signals OUT(1)-OUT(N). During the first frame period, the starting signal STV1 rises from a low voltage level to a high voltage level first, and then the clock signals C1-C4 sequentially rise to the high voltage level, such that the $1^{st}$ to $4^{th}$ stage scan signals OUT(1)-OUT(4) correspondingly rise to the high voltage level. Subsequently, the clock signals C1-C4 sequentially falls to the low voltage level, such that the $1^{st}$ to $4^{th}$ stage scan signals OUT(1)-OUT(4) corresponding fall to the low voltage level. The voltage level transition period of the clock signals C1-C4 is defined as a clock period. For example, when the clock period of the clock signals C1-C4 is T, in a clock period T, the time durations of the high voltage level and the low voltage level are both T/2, and the clock signals C2, C3 and C4 respectively lag the clock signals C1, C2 and C3 by ¼ clock period (i.e. T/4). The $5^{th}$ to $N^{th}$ signals OUT(5)-OUT(N) sequentially rise to the high voltage level and falls to the low voltage level in a same manner based on the abovementioned description, so as to respectively drive the corresponding pixels in the display panel. After the ending signal STV2 rises from the low voltage level to the high voltage level and falls from the high voltage level to the low voltage level, data inputs in the first frame period is completed. The time sequences of the starting signal STV1, the clock signals C1-C4, the ending signal STV2, the pull-down control signals GPW1 and GPW2 and the $1^{st}$ to $N^{th}$ stage scan signals OUT(1)-OUT(N) in the second frame period and subsequent frame periods are also the same as those in the first frame period.

Figure 6:
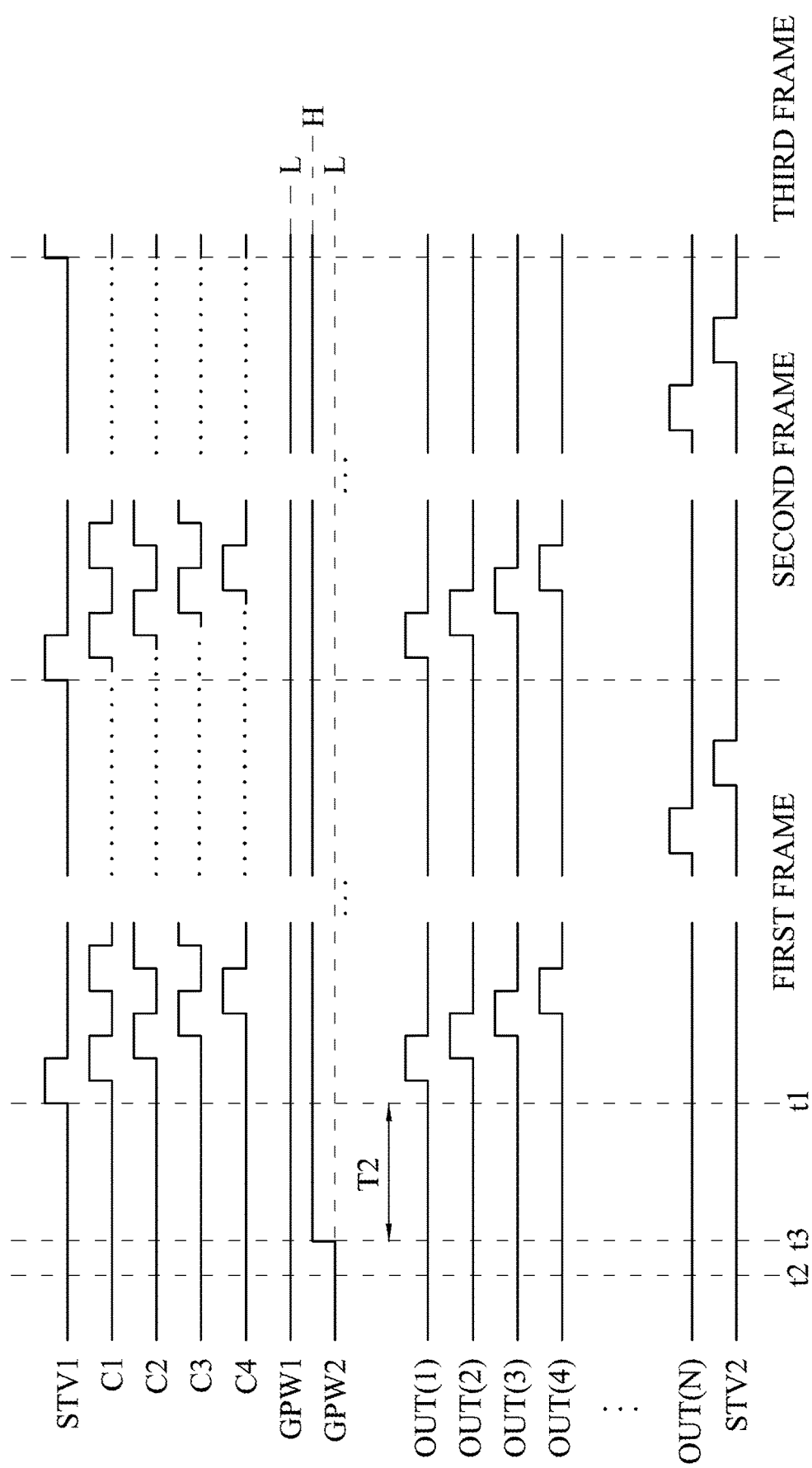
FIG. 6 is another exemplary time sequential diagram in accordance with the gate driving circuit in FIG. 3.

FIG. 6 is another exemplary time sequential diagram in accordance with the gate driving circuit 200 in FIG. 3. The time sequential diagram shown in FIG. 6 is similar to that shown in FIG. 5; the difference between the time sequential diagrams in FIG. 5 and FIG. 6 is that, in FIG. 6, before the display panel switches form the non-display status to the display status, the pull-down control signal GPW2 rises from the low voltage level L to the high voltage level H, and the pull-down control signal GPW1 is at the low voltage level L at the third time point t3, in order to turn on the transistors M12 and M13 in the second pull-down unit 340 to set the voltage levels of the nodes X1 and X2 of the shift registers 210(1)-210(N) to the low voltage level. The low voltage level L and the high voltage level H of the pull-down control signals GPW1 and GPW2 in FIG. 5 and FIG. 6 are also respectively called a disable voltage and an enable voltage. The pull-down control signal GPW2 keeps at the high voltage level H and the pull-down control signal GPW1 keeps at the low voltage level L during a time duration T2. To sum up, as shown in FIG. 5 and FIG. 6, one of the pull-down control signals GPW1 and GPW2 switches from a disable voltage to an enable voltage before the display panel switches from a non-display status to a display status, and the pull-down control signals GPW1 and GPW2 are phase-inverted during a time duration (T1 in FIG. 5 and T2 in FIG. 6) before the display panel switches form a non-display status to the display status. Similar to the descriptions of FIG. 5, the time duration T2 between the third time point t3 at which the pull-down control signal GPW2 rises from the low voltage level L to the high voltage level H and the first time point t1 at which the display panel switches from the non-display status to the display status is greater than or equal to 50 milliseconds and is less than or equal to 1 second, such that the voltage levels of the nodes X1 and X2 of the shift registers 210(1)-210(N) have enough time to be set to the low voltage level. Furthermore, in some embodiments, the time duration T2 is greater than or equal to 100 milliseconds and is less than or equal to 200 milliseconds, and is preferably about 100 milliseconds.

Based on the signal time sequential diagrams shown in FIG. 5 and FIG. 6, the voltage levels of the nodes X1 and X2 of the shift registers 210(1)-210(N) may be preset to the low voltage level before the display panel switches from the non-display status to the display status, so as to prevent the shift registers from being interfered by noise or being affected by abnormal input signals to output abnormal scan signals, ensuring that the display panel does not display an abnormal image when switching from the non-display status to the display status.

In addition, in the embodiments of FIG. 5 and FIG. 6, the high voltage level and the low voltage level for each signal are respectively a relative high voltage value and a relatively low voltage value of the signal; the low voltage levels and the high voltage levels of different signals may be the same or different, and the high voltage levels of different signals may be the same or different. It is noted that, although the pull-down control signal GPW2 keeps at the same low voltage level L from the second time point t2 to the first time point t1 in the embodiment of FIG. 5, but the invention is not limited thereto. In various embodiments, the low voltage level of the pull-down control signal GPW2 from the second time point t2 to the third time point t3 is different from the low voltage level of the pull-down control signal GPW2 from the third time point t3 to the first time point t1. Likewise, although the pull-down control signal GPW1 keeps at the same low voltage level L from the second time point t2 to the first time point t1 in the embodiment of FIG. 6, but the invention is not limited thereto. In various embodiments, the low voltage level of the pull-down control signal GPW1 from the second time point t2 to the third time point t3 is different from the low voltage level of the pull-down control signal GPW1 from the third time point t3 to the first time point t1.

Figure 7:
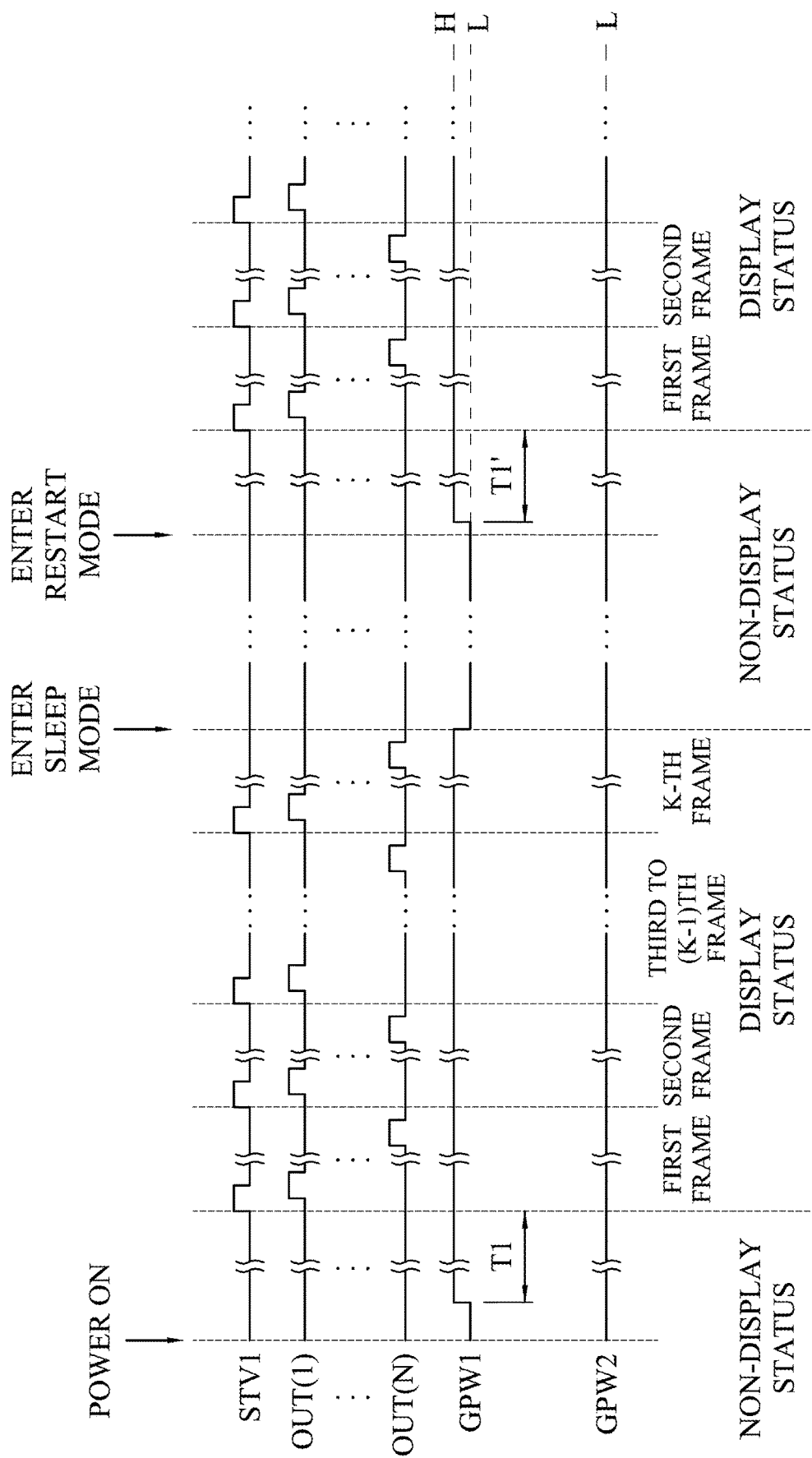
FIG. 7 is an exemplary time sequential diagram of a starting signal and pull-down control signals in various stages in accordance with the gate driving circuit in FIG. 3.

FIG. 7 exemplarily illustrates a time sequential diagram of the starting signal STV1, the $1^{st}$ to $N^{th}$ stage scan signals OUT(1)-OUT(N) and the pull-down control signals GPW1 and GPW2 in various stages in accordance with the gate driving circuit 200 in FIG. 3. As shown in FIG. 7, after the display device is powered on and before the display panel enters the display status, the pull-down control signal GPW1 rise to the high voltage level H from the low voltage level L, and the pull-down control signal GPW2 is at the low voltage level L at a predetermined time point, so as to set the voltage levels of the nodes X1 of X2 the shift registers 210(1)-210(N) to the low voltage level. The pull-down control signal GPW1 keeps at the high voltage level H while the pull-down control signal GPW2 keeps at the low voltage level L during a time duration T1. Then, after the display panel switches to the display status, the pull-down control signals GPW1 and GPW2 are phase-inverted. After the display device enters the sleep mode until entering the restart mode, the pull-down control signals GPW1 and GPW2 all keep at the low voltage level L. Subsequently, after the display device enters the restart mode from the sleep mode and before the display panel start to display images, the pull-down control signal GPW1 rises from the low voltage level L to the high voltage level H, and the pull-down control signal GPW2 is at the low voltage level L at a predetermined time point, in order to set the voltage levels of the nodes X1 and X2 of the shift register 210(1)-210(N) at the low voltage level. The pull-down control signal GPW1 keeps at the high voltage level H while the pull-down control signal GPW2 keeps at the low voltage level L during a time duration T1'. Then, after the display panel enters the display status, the pull-down control signals GPW1 and GPW2 are phase-inverted.

Figure 8:
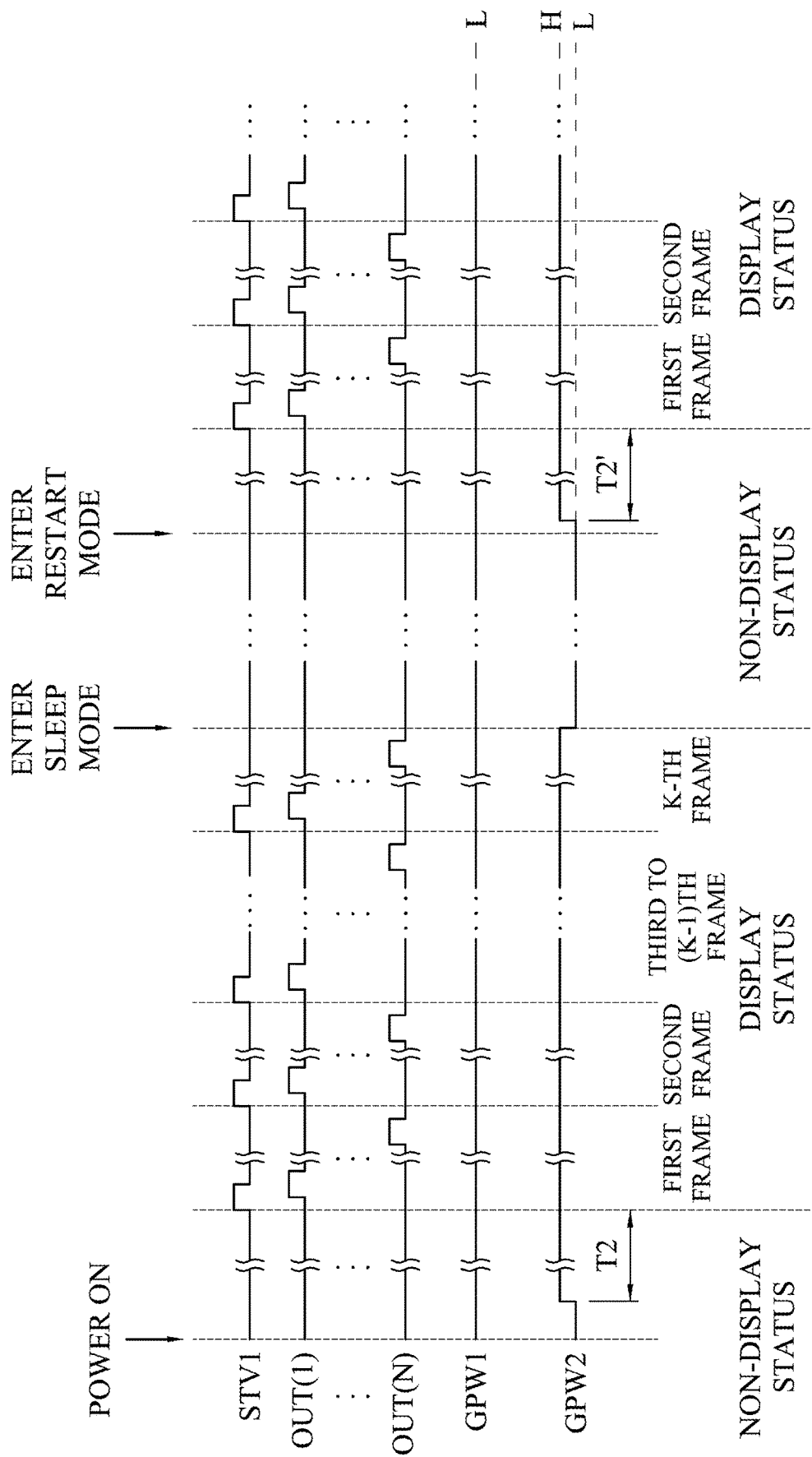
FIG. 8 is another exemplary time sequential diagram of a starting signal and pull-down control signals in various stages in accordance with the gate driving circuit in FIG. 3.

FIG. 8 exemplarily illustrates another time sequential diagram of the starting signal STV1, the $1^{st}$ to $N^{th}$ stage scan signals OUT(1)-OUT(N) and the pull-down control signals GPW1 and GPW2 in various stages in accordance with the gate driving circuit 200 in FIG. 3. The time sequential diagram shown in FIG. 8 is similar to that shown in FIG. 7; the difference between the time sequential diagrams in FIG. 7 and FIG. 8 is that, in FIG. 8, during time durations T2 and T2', the pull-down control signal GPW2 keeps at the high voltage level H while the pull-down control signal GPW1 keeps at the low voltage level L, so as to set the voltage levels of the nodes X1 and X2 of the shift registers 210(1)-210(N) at the low voltage level, and after the display panel enters the display status, the pull-down control signals GPW1 and GPW2 are phase-inverted. To sum up, as shown in FIG. 7 and FIG. 8, the pull-down control signals GPW1 and GPW2 are phase-inverted during a time duration (T1 in FIG. 7 and T2 in FIG. 8) after the display device is powered on and before the display panel switches form a non-display status to the display status, and are phase-inverted during another time duration (T1' in FIG. 7 and T2' in FIG. 8) after the display device enters the restart mode after leaving from the sleep mode and before the display panel switches form a non-display status to the display status.

It is noted that, although in the embodiments of FIG. 7 and FIG. 8, before the display device enters the display status after being powered on, and before the display device enters the restart mode from the sleep mode but does not yet display images, one of the pull-down control signals GPW1 and GPW2 rises from the low voltage level to the high voltage level while the other remains at the low voltage level, but the invention is not limited thereto. In various embodiments, after the display device enters the powered mode before entering the display status, or after the display device enters the restart mode from the sleep mode but does not yet display images, one of the pull-down control signals GPW1 and GPW2 rises from the low voltage level to the high voltage level while the other remains at the low voltage level.

In addition, in some embodiments, the pull-down control signals GPW1 and GPW2 have a voltage level transition period. In the embodiments of FIG. 7 and FIG. 8, the pull-down control signals GPW1 and GPW2 are phase-inverted, and the voltage level transitions of the pull-down control signals GPW1 and GPW2 in the display status after the display device is powered on and the display status after the display panel is restarted are omitted. In the following, several embodiments of voltage level transitions of the pull-down control signals GPW1 and GPW2 are illustrated, in which a display panel with a frame speed of 60 frames per second (FPS) is exemplified for descriptions with regard to the voltage level transition time sequential diagram of the pull-down control signals GPW1 and GPW2.

Figure 9:
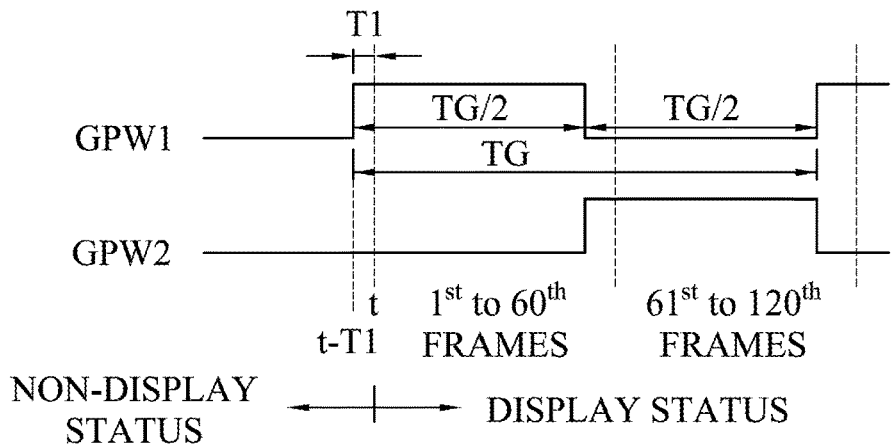
FIG. 9 is an exemplary time sequential diagram of pull-down control signals in various stages in accordance with the gate driving circuit in FIG. 3.

FIG. 9 is an exemplary time sequential diagram of the pull-down control signals GPW1 and GPW2 in accordance with the gate driving circuit 200 in FIG. 3. The pull-down control signals GPW1 and GPW2 have a signal period TG in which the high voltage level duration and the low voltage level duration are both TG/2, and a half of the signal period TG (i.e. TG/2) is greater than the time duration T1. In the time sequential diagram shown in FIG. 9, the display panel switches from the non-display status to the display status at the time point t, and before the time point (t−T1), both of the pull-down control signals GPW1 and GPW2 are the low voltage level. At the time point (t−T1), the pull-down control signal GPW1 rises from the low voltage level to the high voltage level, the pull-down control signal GPW2 is at the low voltage level. The pull-down control signal GPW1 keeps at the high voltage level while the pull-down control signal GPW2 keeps at the low voltage level during the time duration T1. Therefore, during the time duration T1 between the time point (t−T1) and the time point t, i.e., before the display status, the first pull-down unit 330 set the nodes X1 and X2 to the low voltage level for each stage of the shift registers 210(1)-210(N). The pull-down control signals GPW1 and GPW2 respectively keep at the high voltage level and the low voltage level during a time duration ((TG/2)−T1) after the display panel enters the first frame period in the display status. Then, the pull-down control signal GPW1 falls from the high voltage level to the low voltage level, the pull-down control signal GPW2 rises from the low voltage level to the high voltage level, and the pull-down control signals GPW1 and GPW2 are phase-inverted in the display status. In the embodiment of FIG. 9, the signal period TG of the pull-down control signals GPW1 and GPW2 is 2 seconds, the pull-down control signal GPW1 differs the pull-down control signal GPW2 by ½ of the signal period TG, and the time duration T1 is less than 1 second, and therefore, after the time point (t−T1) in the non-display status and until the time point (t+((TG/2)−T1)) in the display status, the pull-down control signals GPW1 and GPW2 respectively keep at the high voltage level and the low voltage level, and the pull-down control signals GPW1 and GPW2 are phase-inverted in the display status. However, the invention is not limited thereto. In a variant embodiment, the time sequences of the pull-down control signals GPW1 and GPW2 in FIG. 9 may be exchanged, i.e., the signal labels GPW1 and GPW2 in FIG. 9 may be modified to GPW2 and GPW1, respectively, and the time duration label T1 may be modified to T2 as shown in FIG. 6.

Figure 10:
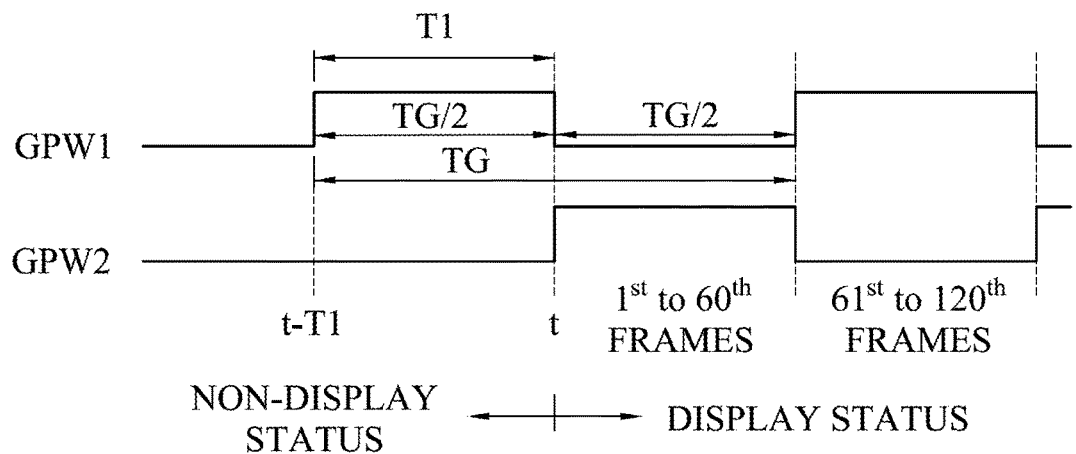
FIG. 10 is another exemplary time sequential diagram of pull-down control signals in various stages in accordance with the gate driving circuit in FIG. 3.

FIG. 10 is another exemplary time sequential diagram of the pull-down control signals GPW1 and GPW2 in accordance with the gate driving circuit 200 in FIG. 3. In this embodiment, a half of the signal period TG (i.e. TG/2) is equal to the time duration T1. The time sequential diagram shown in FIG. 10 is similar to that shown in FIG. 9, and the difference therebetween is that, in FIG. 10, at the time point (t−T1), the pull-down control signal GPW1 rises from the low voltage level to the high voltage level, the pull-down control signal GPW2 is at the low voltage level, and the pull-down control signal GPW1 keeps at the high voltage level and the pull-down control signal GPW2 keeps at the low voltage level during the time duration T1; at the time point t, i.e. at which the display panel switches form the non-display status to the display status, the pull-down control signal GPW1 falls from the high voltage level to the low voltage level, and the pull-down control signal GPW2 rises from the low voltage level to the high voltage level, and in the display status, the pull-down control signals GPW1 and GPW2 are phase-inverted. In the embodiment of FIG. 10, the signal period TG of the pull-down control signals GPW1 and GPW2 is 2 second, the pull-down control signals GPW1 differs the pull-down control signal GPW2 by ½ of the signal period TG, and the time duration T1 is 1 second, and thus the voltage levels of the pull-down control signals GPW1 and GPW2 switch at the end of each second after the display panel enters the display status, i.e., after the $60^{th}$ frame period, the $120^{th}$ frame period, and so on. However, the invention is not limited thereto. In a variant embodiment, the time sequences of the pull-down control signals GPW1 and GPW2 in FIG. 10 may be exchanged, i.e., the signal labels GPW1 and GPW2 in FIG. 10 may be modified to GPW2 and GPW1, respectively, and the time duration label T1 may be modified to T2 as shown in FIG. 6.

Figure 11:
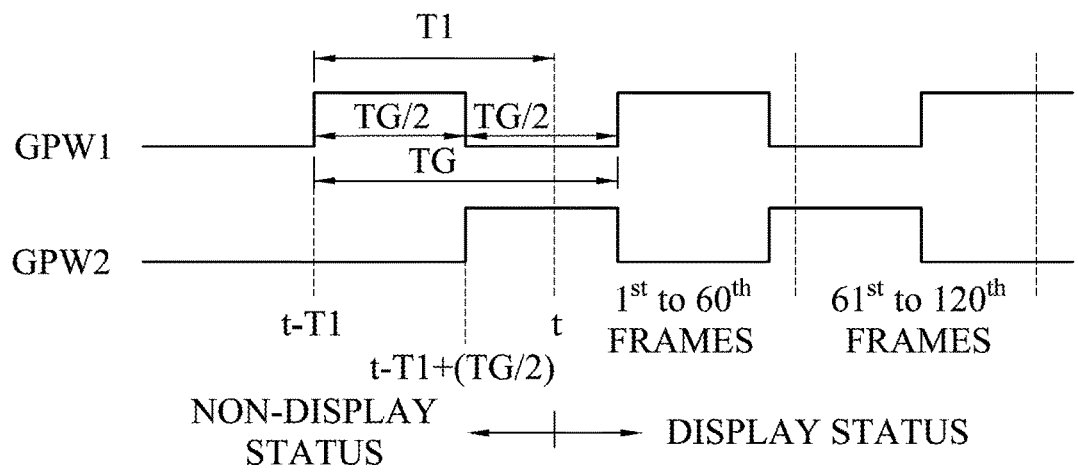
FIG. 11 is yet another exemplary time sequential diagram of pull-down control signals in various stages in accordance with the gate driving circuit in FIG. 3.

FIG. 11 is yet another exemplary time sequential diagram of the pull-down control signals GPW1 and GPW2 in accordance with the gate driving circuit 200 in FIG. 3. In this embodiment, a half of the signal period TG (i.e. TG/2) is less than the time duration T1. The time sequential diagram shown in FIG. 11 is similar to that shown in FIG. 10, and the difference therebetween is that, in FIG. 11, at the time point (t−T1), the pull-down control signal GPW1 rises from the low voltage level to the high voltage level, the pull-down control signal GPW2 is at the low voltage level, and the pull-down control signal GPW1 keeps at the high voltage level and the pull-down control signal GPW2 keeps at the low voltage level during the time duration (TG/2); at the time point (t−T1+(TG/2)), the pull-down control signal GPW1 falls from the high voltage level to the low voltage level, the pull-down control signal GPW2 rises form the low voltage level to the high voltage level, and the pull-down control signal GPW1 keeps at the low voltage level while the pull-down control signal GPW2 keeps at the high voltage level from the time point (t−T1+(TG/2)) to the time point tin the non-display status. Therefore, during the time duration between the time point (t−T1) and the time point (t−T1+(TG/2)), the first pull-down unit 330 set the nodes X1 and X2 to the low voltage level for each stage of the shift registers 210(1)-210(N); during the time duration between the time point (t−T1+(TG/2)) and the time point t, the second pull-down unit 340 set the nodes X1 and X2 to the low voltage level for each stage of the shift registers 210(1)-210(N). The pull-down control signals GPW1 and GPW2 respectively keep at the low voltage level and the high voltage level from a time point t to a time point (t−T1+TG) after the display panel enters the first frame period in the display status. Then, the pull-down control signal GPW1 rises from the low voltage level to the high voltage level, the pull-down control signal GPW2 falls from the high voltage level to the low voltage level, and the pull-down control signals GPW1 and GPW2 are phase-inverted in the display status. In the embodiment of FIG. 11, the signal period TG of the pull-down control signals GPW1 and GPW2 is less than 2 seconds, such that before the display panel switches form the non-display status to the display status, the pull-down control signal GPW1 rises form the low voltage level to the high voltage level and then falls from the high voltage level to the low voltage level, and the pull-down control signal GPW2 rises from the low voltage level to the high voltage level at the same time as when the pull-down control signal GPW1 falls from the high voltage level to the low voltage level. As such, each of the pull-down control signals GPW1 and GPW2 has one or more voltage level transitions in each second after the display panel enters the display status. However, the invention is not limited thereto. In a variant embodiment, the time sequences of the pull-down control signals GPW1 and GPW2 in FIG. 11 may be exchanged, the time sequences of the pull-down control signals GPW1 and GPW2 in FIG. 11 may be exchanged, i.e., the signal labels GPW1 and GPW2 in FIG. 11 may be modified to GPW2 and GPW1, respectively, and the time duration label T1 may be modified to T2 as shown in FIG. 6. To sum up, as shown in FIG. 9 to FIG. 11, at least one of the first pull-down control signal GPW1 and the second pull-down control signal GPW2 switches from a disable voltage to an enable voltage before the display panel switches from a non-display status to a display status of the display panel, and the first pull-down control signal GPW1 and the second pull-down control signal GPW2 are phase-inverted during a time duration before the display panel switches from the non-display status to the display status.

It is noted that the time sequential diagram shown in FIG. 9 to FIG. 11 are merely examples and are not meant to limit the scope of the invention. Therefore, any modification made based on the specification and drawings of the application shall be covered in the scope of the invention. In summary, before the display panel switches from the non-display status to the display status, i.e., before the $1^{st}$ stage scan signal outputted by the $1^{st}$ stage shift register rises from the low voltage level to the high voltage level, the pull-down control signals GPW1 and GPW2 respectively keep at the high voltage level and the low voltage level during a time period. In other words, the pull-down control signals GPW1 and GPW2 are phase-inverted before the display panel switches from the non-display status to the display status, such that the first pull-down unit or the second pull-down unit sets the nodes X1 and X2 to be at the low voltage level for each stage of the shift registers, in order to prevent noise from affecting image displaying of the display panel.

It is noted that, although the equivalent circuit diagram illustrated in FIG. 4 includes the first pull-down unit 340 and the second pull-down unit 350, the invention is not limited thereto. In another varied embodiments, the $i^{th}$ stage shift register 210(i) of the gate driving circuit 200 may include only one pull-down unit or more than two pull-down units. For example, the $i^{th}$ stage shift register 210(i) of the gate driving circuit 200 may include only one pull-down unit that is coupled to the nodes X1 and X2 and is configured to receive a pull-down control signal, and the pull-down control signals switches from a disable voltage to an enable voltage before the display panel switches from the non-display status to the display status, such that the pull-down unit set the nodes X1 and X2 to be at the low voltage level for each stage of the shift registers, in order to prevent noise from affecting image displaying of the display panel. In a further varied embodiment, the number of transistors and the coupling method between the transistors in the reset unit 310, the pull-up unit 320, the pre-charge unit 330, the first pull-down unit 340 and the second pull-down unit 350 may also be different from those shown in FIG. 4.

Figure 12:
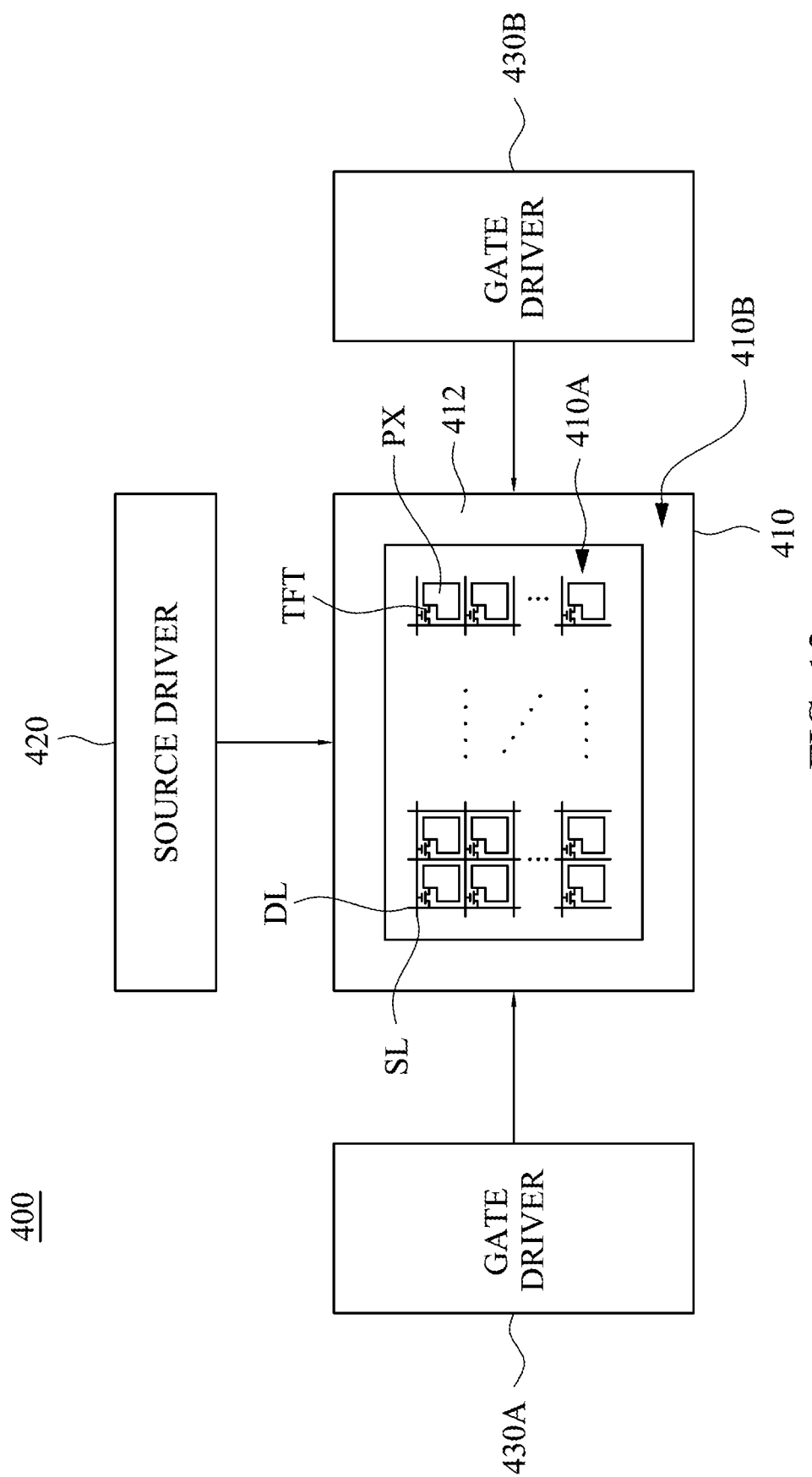
FIG. 12 is a schematic diagram of a display device in accordance with some embodiments of the invention.

Referring to FIG. 12, FIG. 12 is a schematic diagram of a display device 400. The display device 400 includes a display panel 410, a source driver 420 and gate drivers 430A and 430B, in which the display panel 410 has a display region 410A and a non-display region 410B. In the display region 410A, data lines DL, gate lines SL and pixels PX arranged in a matrix are formed on the substrate 412, and such pixels PX collectively display an image by the driving of the source driving signals and the gate driving signals. In the non-display region 410B, wirings (not shown) are respectively coupled to the source driver 420 and the gate drivers 430A and 430B and are respectively coupled to the data lines DL and the gate lines SL in the display region 410A, so as to respectively send the source driving signals and the gate driving signals to thin film transistors TFT of the corresponding pixels PX, such that the pixels PX display corresponding gray levels in a particular time under the on-off switch control of the thin film transistors TFT. The display device 400 is similar to the display device 400 of FIG. 1. The difference between the display device 100 and the display device 400 is that the display device 400 includes two gate drivers 430A and 430B. As shown in FIG. 12, the gate drivers 430A and 430B are disposed at the left and right sides of the display panel 410, respectively, and collectively transmit gate driving signals to the display panel 410. In other embodiments, the disposal of the gate drivers 430A and 430B may be adjusted in accordance with various design requirements. The display panel 410 and the source driver 420 are approximately the same as the display panel 110 and the source driver 120 of FIG. 1, respectively, and the description is not described again herein.

Figure 13:
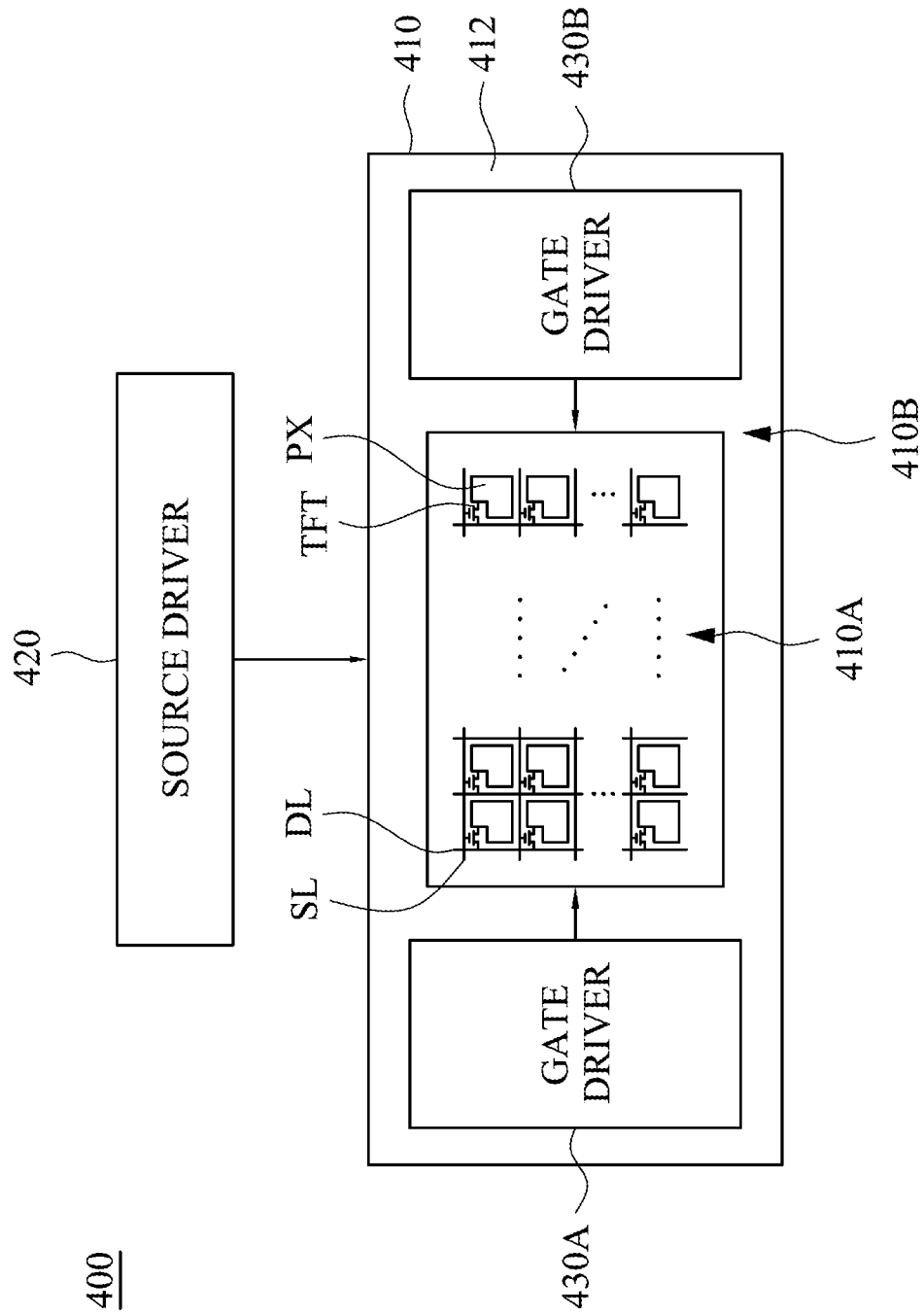
FIG. 13 is a schematic diagram of a display device in accordance with some embodiments of the invention.

Likewise, the source driver 420 and/or the gate drivers 430A and 430B in FIG. 12 may be integrated in the display panel 410. As shown in FIG. 13, the display device 400 of the invention may be an SOG panel, in which the gate drivers 430A and 430B are formed in the non-display region 410B of the display panel 410. As such, the electrical components in the gate drivers 430 and 430B and the display region 410A may be formed simultaneously by the same process or processes. For example, the TFTs of the gate driving circuit in the gate drivers 430A and 430B and the TFTs of pixels in the display region 410A of the display panel 410 may be formed simultaneously by the same process or processes. In other embodiments, the source driver 420 may also be formed in the non-display region 410B of the display panel 410, and the electrical components and wirings in the display panel 410, the source driver 420 and the gate drivers 430A and 430B may be formed simultaneously by the same process or processes.

Figure 14:
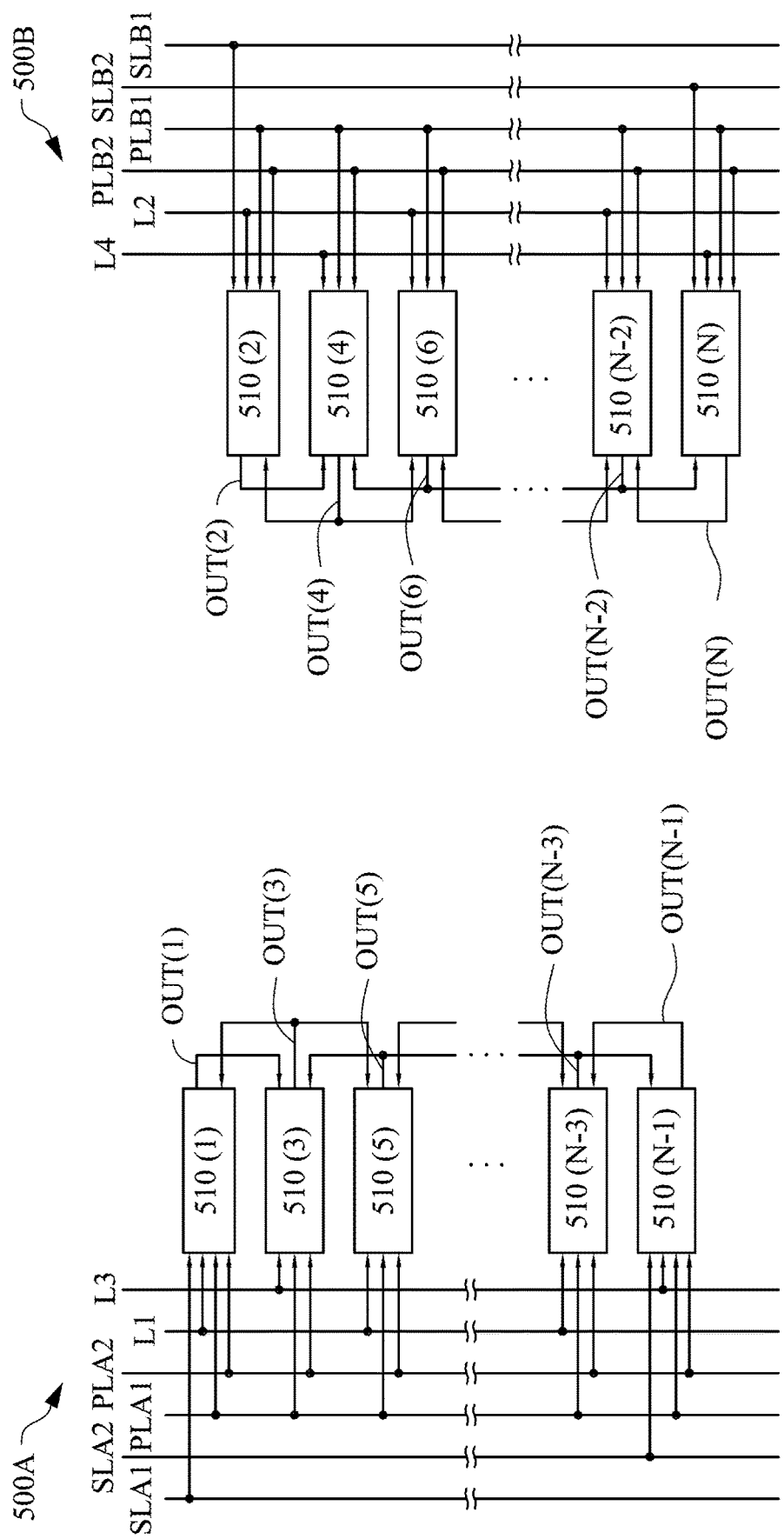
FIG. 14 is a schematic diagram of a gate driving circuit in accordance with some embodiments of the invention.

Referring to FIG. 14, which illustrates a schematic diagram of a gate driving circuits 500A and 500B in accordance with some embodiments of the invention. The gate driving circuits 500A and 500B may be applied to the display device 400 in FIG. 12 or FIG. 13, or another similar display device. In the following, the gate driving circuits 500A and 500B applied to the display device 400 in FIG. 13 are exemplified for description. The gate driving circuits 500A and 500B are parts of the gate drivers 430A and 430B, respectively. The gate driving circuits 500A and 500B collectively include $1^{st}$ to $N^{th}$ stage shift registers 510(1)-510(N), where N is an integer greater than or equal to 5. The $1^{st}$ to $N^{th}$ stage shift registers 510(1)-510(N) are a GOA circuit structure. The equivalent circuits of the shift registers 510(1)-510(N) are the same as the equivalent circuit of the shift register 210($i$) in FIG. 4. The gate driving circuit 500A includes the odd-numbered stage shift registers 510(1), 510(3), . . . and 510(N-1) of the $1^{st}$ to $N^{th}$ stage shift registers 510(1)-510(N), and the gate driving circuit 500B includes the even-numbered stage shift registers 510(2), 510(4), . . . and 510(N) of the $1^{st}$ to $N^{th}$ stage shift registers 510(1)-510(N). In addition, the gate driving circuit 500A further includes clock signal lines L1 and L3, a starting signal line SLA1, an ending signal line SLA2 and pull-down control signal lines PLA1 and PLA2, and the gate driving circuit 500B includes clock signal lines L2 and L4, a starting signal line SLB1, an ending signal line SLB2 and pull-down control signal lines PLB1 and PLB2. In some embodiments, N is a multiple of 4. The clock signals lines L1-L4 respectively provide clock signals C1-C4 to the corresponding shift registers 510(1)-510(N). In the embodiments where N is a multiple of 4, the clock signal line L1 provides the clock signal C1 to the $1^{st}$ stage shift register 510(1), the $5^{th}$ stage shift register 510(5), . . . and the $(N-3)^{th}$ stage shift register 510(N-3) in the gate driving circuit 500A, the clock signal line L2 provides the clock signal C2 to the $2^{nd}$ stage shift register 510(2), the $6^{th}$ stage shift register 510(6), . . . and the $(N-2)^{th}$ stage shift register 510(N-2) in the gate driving circuit 500B, the clock signal line L3 provides the clock signal C3 to the $3^{rd}$ stage shift register 510(3), the $7^{th}$ stage shift register 510(7), . . . and the $(N-1)^{th}$ stage shift register 510(N-1) in the gate driving circuit 500A, and the clock signal line L4 provides the clock signal C4 to the $4^{th}$ stage shift register 510(4), the $8^{th}$ stage shift register 510(8), . . . and the $N^{th}$ stage shift register 510(N) in the gate driving circuit 500B. In addition, the starting signal lines SLA1 and SLB1 provide a starting signal STV1 to the $1^{st}$ and $2^{nd}$ stage shift registers 510(1) and 510(2), and the ending signal lines SLA2 and SLB2 provide an ending signal STV2 to the $(N-1)^{th}$ and $N^{th}$ stage shift registers 510(N-1) and 510(N). The pull-down control signal lines PLA1 and PLA2 respectively provide pull-down control signals GPW1 and GPW2 to the odd-numbered stage shift registers 510(1), 510(3), . . . and 510(N-1). The pull-down control signal lines PLB1 and PLB2 respectively provide pull-down control signals GPW1 and GPW2 to the even-numbered stage shift registers 510(2), 510(4), . . . and 510(N). The clock signal lines L1-L4, the starting signal lines SLA1 and SLB1, the ending signal lines SLA2 and SLB2 and the pull-down control signal lines PLA1, PLB1, PLA2 and PLB2 may be coupled to one or more chips. That is, the clock signals C1-C4, the starting signal STV1, the ending signal STV2 and the pull-down control signals GPW1 and GPW2 may be provided by the chip(s), such as a controller chip and/or a driver chip, but are not limited thereto.

The $1^{st}$ to $N^{th}$ stage shift registers 510(1)-510(N) respectively generate $1^{st}$ to $N^{th}$ stage scan signals OUT(1)-OUT(N). The $1^{st}$ and $2^{nd}$ stage scan signals OUT(1) and OUT(2) are respectively inputted to the $3^{rd}$ and $4^{th}$ stage shift registers 510(3) and 510(4), the (N-1)th and $N^{th}$ scan signals OUT(N-1) and OUT(N) are respectively inputted to the $(N-3)^{th}$ and $(N-2)^{th}$ stage shift registers 510(N-3) and 510(N-2), and each of the $3^{rd}$ to $(N-2)^{th}$ stage scan signals OUT(3)-OUT(N-2) is inputted to the shift registers previous two stage of shift register thereto and next two stage of shift register thereto. For illustration, the $3^{rd}$ stage scan signal OUT(3) is inputted to the $1^{st}$ and $5^{th}$ shift registers 510(1) and 510(5).

In the aforementioned embodiments, the time sequential diagram of all signals (including the starting signal STV1, the clock signals C1-C4, the ending signal STV2, the pull-down control signal GPW1 and GPW2 and the $1^{st}$ stage to $N^{th}$ stage scan signals OUT(1)-OUT(N)) in the gate driving circuits 500A and 500B is the same as that shown in FIG. 5 and FIG. 6, and thus the related descriptions thereof may refer to the preceding paragraphs and are which are not repeated herein. In addition, the voltage level transition time sequences of the pull-down control signals GPW1 and GPW2 of the gate driving circuits 500A and 500B may also be the same as the time sequential diagram shown in any of FIG. 5 to FIG. 11, so as to set the nodes X1 and X2 in $1^{st}$ to $N^{th}$ stage shift registers 510(1)-510(N) to be at the low voltage level before the display panel switches from the non-display status to the display status. In other embodiments, the signals respectively inputted by the starting signal line SLA1 and the ending signal line SLA2 of the gate driving circuit 500A may be different from those respectively inputted by the starting signal line SLB1 and the ending signal line SLB2 of the gate driving circuit 500B.

Figure 15:
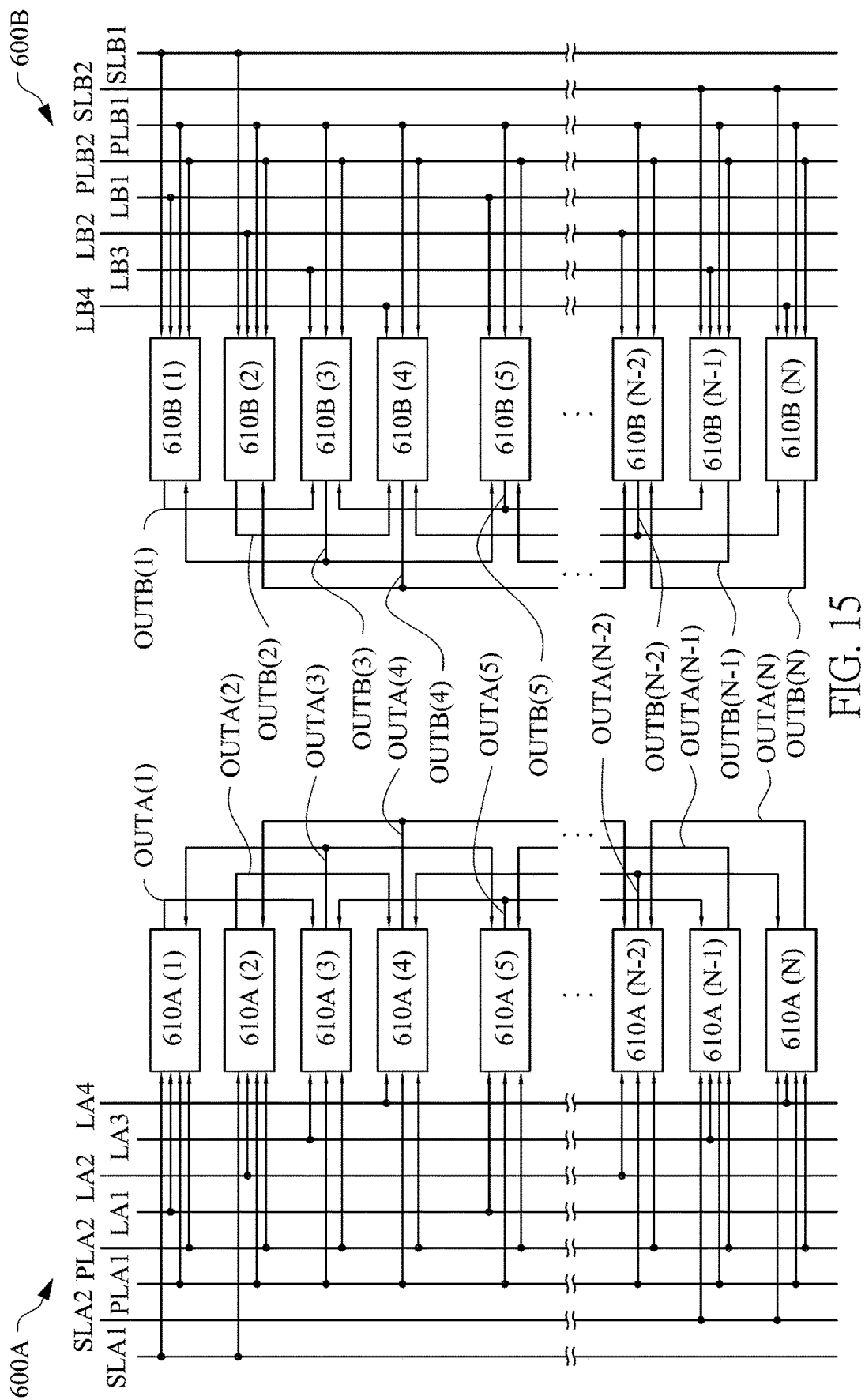
FIG. 15 is a schematic diagram of a gate driving circuit in accordance with some embodiments of the invention.

Referring to FIG. 15, which illustrates a schematic diagram of a gate driving circuits 600A and 600E in accordance with some embodiments of the invention. The gate driving circuits 600A and 600B may be applied to the display device 400 in FIG. 12 or FIG. 13, or another similar display device. In the following, the gate driving circuits 600A and 600B applied to the display device 400 in FIG. 13 are exemplified for description. The gate driving circuits 600A and 600B are parts of the gate drivers 430A and 430B, respectively, and respectively drive the pixels PX in the display region 410A at two opposite sides of the display panel 410, so as to enhance the driving ability to the display panel 410. The gate driving circuits 600A and 600B respectively include $1^{st}$ to $N^{th}$ stage shift registers 610A(1)-610A(N) and $1^{st}$ to $N^{th}$ stage shift registers 610B(1)-610B(N), where N is an integer greater than or equal to 5. The $1^{st}$ to $N^{th}$ stage shift registers 610A(1)-610A(N) and the $1^{st}$ to $N^{th}$ stage shift registers 610B(1)-610B(N) are a GOA circuit structure. The equivalent circuits of the shift registers 610A(1)-610A(N) and 610B(1)-610B(N) are the same as the equivalent circuit of the shift register 210(i) in FIG. 4. In addition, the gate driving circuit 600A further includes clock signal lines LA1-LA4 and, a starting signal line SLA1, an ending signal line SLA2 and pull-down control signal lines PLA1 and PLA2, and the gate driving circuit 600B includes clock signal lines LB1-LB4, a starting signal line SLB1, an ending signal line SLB2 and pull-down control signal lines PLB1 and PLB2. In some embodiments, N is a multiple of 4. The clock signals lines LA1-LA4 and LB1-LB4 respectively provide clock signals CA1-CA4 and CB1-CB4 to the corresponding shift registers 610A(1)-610A(N) and 610B(1)-610B(N). In the embodiments where N is a multiple of 4, the clock signal line LA1/LB1 provides the clock signal CA1/CB1 to the $1^{st}$ stage shift register 610A(1)/610B(1), the $5^{th}$ stage shift register 610A(5)/610B(5), . . . and the $(N-3)^{th}$ stage shift register 610A(N-3)/610B(N-3) in the gate driving circuit 600A/600B, the clock signal line LA2/LB2 provides the clock signal CA2/CB2 to the $2^{nd}$ stage shift register 610A(2)/610B(2), the $6^{th}$ stage shift register 610A(6)/610B(6), . . . and the $(N-2)^{th}$ stage shift register 610A(N-2)/610B(N-2) in the gate driving circuit 600A/600B, the clock signal line LA3/LB3 provides the clock signal CA3/CB3 to the $3^{rd}$ stage shift register 610A(3)/610B(3), the $7^{th}$ stage shift register 610A(7)/610B(7), . . . and the $(N-1)^{th}$ stage shift register 610A(N-1)/610B(N-1) in the gate driving circuit 600A/600B, and the clock signal line LA4/LB4 provides the clock signal CA4/CB4 to the $4^{th}$ stage shift register 610A(4)/610B(4), the $8^{th}$ stage shift register 610A(8)/610B(8), . . . and the $N^{th}$ stage shift register 610A(N)/610B(N) in the gate driving circuit 600A/600B. In addition, the starting signal line SLA1 provides a starting signal STVA1 to the $1^{st}$ and $2^{nd}$ stage shift registers 610A(1) and 610A(2), the starting signal line SLB1 provides a starting signal STVB1 to the $1^{st}$ and $2^{nd}$ stage shift registers 610B(1) and 610B(2), the ending signal line SLA2 provides an ending signal STVA2 to the $(N-1)^{th}$ and $N^{th}$ stage shift registers 610A(N-1) and 610A(N), and the ending signal line SLB2 provides an ending signal STVB2 to the $(N-1)^{th}$ and $N^{th}$ stage shift registers 610B(N-1) and 610B(N). The pull-down control signal lines PLA1 and PLB1 provide a pull-down control signal GPW1 to the $1^{st}$ to $N^{th}$ stage shift registers 610A(1)-610A(N) and 610B(1)-610B(N), and the pull-down control signal lines PLA2 and PLB2 provide a pull-down control signal GPW2 to the $1^{st}$ to $N^{th}$ stage shift registers 610A(1)-610A(N) and 610B(1)-610B(N). The clock signal lines LA1-LA4 and LB1-LB4, the starting signal lines SLA1 and SLB1, the ending signal lines SLA2 and SLB2 and the pull-down control signal lines PLA1, PLB1, PLA2 and PLB2 may be coupled to one or more chips. That is, the clock signals CA1-CA4 and CB1-CB4, the starting signals STVA1 and STVB1, the ending signals STVA2 and STVB2 and the pull-down control signals GPW1 and GPW2 may be provided by the chip(s), such as a controller chip and/or a driver circuit, but are not limited thereto.

The $1^{st}$ to $N^{th}$ stage shift registers 610A(1)-610A(N) and the $1^{st}$ to $N^{th}$ stage shift registers 610B(1)-610B(N) respectively generate $1^{st}$ to $N^{th}$ stage scan signals OUTA(1)-OUTA(N) and $1^{st}$ to $N^{th}$ stage scan signals OUTB(1)-OUTB(N). The $1^{st}$ and $2^{nd}$ stage scan signals OUTA(1)/OUTB(1) and OUTA(2)/OUTB(2) are respectively inputted to the $3^{rd}$ and $4^{th}$ stage shift registers 610A(3)/610B(3) and 610A(4)/610B(4), the (N-1)th and $N^{th}$ scan signals OUTA(N-1)/OUTB(1) and OUTA(N)/OUTB(N) are respectively inputted to the $(N-3)^{th}$ and $(N-2)^{th}$ stage shift registers 610A(N-3)/610B(N-3) and 610A(N-2)/610B(N-2), and each of the $3^{rd}$ to $(N-2)^{th}$ stage scan signals OUTA(3)-OUTA(N-2) of the $3^{rd}$ to $(N-2)^{th}$ stage scan signals OUTB(3)-OUTB(N-2) is inputted to the shift registers previous two stage of shift register thereto and next two stage of shift register thereto. For illustration, the $3^{rd}$ stage scan signal OUTA(3) is inputted to the $1^{st}$ and $5^{th}$ shift registers 610A(1) and 610A(5).

The same stage of those among the scan signals OUTA(1)-OUTA(N) and OUTB(1)-OUTB(N) are the same; that is, the $1^{st}$ stage scan signals OUTA(1) and OUTB(1) are the same, the $2^{nd}$ stage scan signals OUTA(2) and OUTB(2) are the same, . . . and the like. In addition, the clock signals CA1-CA4/CB1-CB4, the starting signal STVA1/STVB1, the ending signal STVA2/STVB2, the pull-down control signals GPW1 and GPW2 and the $1^{st}$ to $N^{th}$ stage scan signals OUTA(1)-OUTA(N)/OUTB(1)-OUTB(N) in the gate driving circuit 600A/600B may respectively correspond to the clock signals C1-C4, the starting signal STV1, the ending signal STV2, the pull-down control signal GPW1 and GPW2 and the $1^{st}$ to $N^{th}$ stage scan signals OUT(1)-OUT(N) in the gate driving circuit 200, and the driving mechanisms of the gate driving circuit 600A and 600B may be the same as the driving mechanism of the gate driving circuit 200, and thus the related descriptions thereof may refer to the preceding paragraphs and are not repeated herein. In addition, the voltage level transition time sequences of the pull-down control signals GPW1 and GPW2 of the gate driving circuits 600A and 600B may also be the same as the time sequential diagram shown in any of FIG. 5 to FIG. 11, so as to reset the $1^{st}$ to $N^{th}$ stage shift registers 610A(1)-610A(N) and 610B(1)-610B(N) before the display panel switches from the non-display status to the display status.

In summary, the gate driving circuit of the invention and the display panel with such gate driving circuit have voltage level reset function and are able to prevent the shift registers from being affected by noise interferences to output abnormal scan signals, ensuring that the display panel displays correct images in each frame period.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A gate driving circuit, comprising:
  $1^{st}$ to $N^{th}$ stage shift registers configured to respectively provide $1^{st}$ to $N^{th}$ stage scan signals to $1^{st}$ to $N^{th}$ gate lines of a display panel of a display device, wherein N is an integer greater than 1;
  wherein an $i^{th}$ stage shift register of the $1^{st}$ to $N^{th}$ stage shift registers comprises:
    a pre-charge unit that is coupled to a first node of the $i^{th}$ stage shift register and is configured to receive a first input signal and output a pre-charge signal to the first node;
    a pull-up unit that is coupled to the first node and a second node of the $i^{th}$ stage shift register and is configured to output an $i^{th}$ stage scan signal of the $1^{st}$ to $N^{th}$ stage scan signals to the second node; and
    a pull-down unit that is coupled to the first node and the second node and is configured to receive a pull-down control signal;
  wherein i is an integer that is greater than or equal to 1 and is smaller than or equal to N, the first input signal received by the $1^{st}$ stage shift register switches from a low voltage level to a high voltage level at a first time point, and the pull-down control signal switches from a disable voltage to an enable voltage before the display panel switches from a non-display status to a display status and before the first time point.

2. The gate driving circuit of claim 1, wherein the $i^{th}$ stage shift register further comprises another pull-down unit; wherein:
  the pull-down unit is configured to further receive another pull-down control signal; and
  the another pull-down unit is coupled to the first node and the second node and is configured to receive the pull-down control signal and the another pull-down control signal.

3. The gate driving circuit of claim 2, wherein the pull-down control signal and the another pull-down control signal are phase inverted during a time duration before the display panel switches from the non-display status to the display status, and the time duration is greater than or equal to 50 milliseconds and is less than or equal to 1 second.

4. The gate driving circuit of claim 2, wherein the pull-down unit comprises:
  a fourth transistor, wherein a control terminal and a first terminal of the fourth transistor are configured to receive the pull-down control signal;
  a fifth transistor, wherein a control terminal of the fifth transistor is configured to receive the another pull-down control signal, a first terminal of the fifth transistor is coupled to a reference voltage, and a second terminal of the fifth transistor is coupled to a second terminal of the fourth transistor;
  a sixth transistor, wherein a control terminal of the sixth transistor is coupled to the first node, a first terminal of the sixth transistor is coupled to the reference voltage, and a second terminal of the sixth transistor is coupled to the second terminal of the fourth transistor;
  a seventh transistor, wherein a control terminal of the seventh transistor is coupled to the second terminal of the sixth transistor, a first terminal of the seventh transistor is coupled to the reference voltage, and a second terminal of the seventh transistor is coupled to the first node; and
  an eighth transistor, wherein a control terminal of the eighth transistor is coupled to the second terminal of the sixth transistor, a first terminal of the eighth transistor is coupled to the reference voltage, and a second terminal of the eighth transistor is coupled to the second node.

5. The gate driving circuit of claim 4, wherein the another pull-down unit further comprises:
  a ninth transistor, wherein a control terminal and a first terminal of the ninth transistor are configured to receive the another pull-down control signal;
  a tenth transistor, wherein a control terminal of the tenth transistor is configured to receive the pull-down control signal, a first terminal of the tenth transistor is coupled to the reference voltage, and a second terminal of the tenth transistor is coupled to a second terminal of the ninth transistor;
  an eleventh transistor, wherein a control terminal of the eleventh transistor is coupled to the first node, a first terminal of the eleventh transistor is coupled to the reference voltage, and a second terminal of the eleventh transistor is coupled to the second terminal of the ninth transistor;
  a twelfth transistor, wherein a control terminal of the twelfth transistor is coupled to the second terminal of the eleventh transistor, a first terminal of the twelfth transistor is coupled to the reference voltage, and a second terminal of the twelfth transistor is coupled to the first node; and
  a thirteenth transistor, wherein a control terminal of the thirteenth transistor is coupled to the second terminal of the eleventh transistor, a first terminal of the thirteenth transistor is coupled to the reference voltage, and a second terminal of the thirteenth transistor is coupled to the second node.

6. The gate driving circuit of claim 1, wherein the first input signal received by the $1^{st}$ stage shift register is a starting signal.

7. The gate driving circuit of claim 1, wherein the pull-down control signal switches from the disable voltage to the enable voltage before the display panel displays a first frame after the display device leaves a sleep mode.

8. The gate driving circuit of claim 1, wherein the pull-down control signal switches from the disable voltage to the enable voltage before the display panel displays a first frame after the display device is powered on.

9. The gate driving circuit of claim 1, wherein the pull-down control signal keeps at the enable voltage during a time duration before the display panel switches from the non-display status to the display status, and the time duration is greater than or equal to 50 milliseconds and is less than or equal to 1 second.

10. The gate driving circuit of claim 1, wherein the pre-charge unit comprises:
  a first transistor, wherein a control terminal of the first transistor is configured to receive the first input signal, a first terminal of the first transistor is configured to receive a forward input signal, and a second terminal of the first transistor is coupled to the first node; and
  a second transistor, wherein a control terminal of the second transistor is configured to receive a second input signal, a first terminal of the second transistor is configured to receive a backward input signal, and a second terminal of the second transistor is coupled to the second terminal of the first transistor.

11. The gate driving circuit of claim 1, wherein the pull-up unit comprises:
a third transistor, wherein a control terminal of the third transistor is configured to receive the pre-charge signal, a first terminal of the third transistor is configured to receive a clock signal, and a second terminal of the third transistor is configured to output the $i^{th}$ stage scan signal; and
a capacitor, wherein a first terminal of the capacitor is coupled to the control terminal of the third transistor, and a second terminal of the capacitor is coupled to the second terminal of the third transistor.

12. A gate driving circuit, comprising:
$1^{st}$ to $N^{th}$ stage shift registers configured to respectively provide $1^{st}$ to $N^{th}$ stage scan signals to $1^{st}$ to $N^{th}$ gate lines of a display panel, wherein N is an integer greater than 1;
wherein an $i^{th}$ stage shift register of the $1^{st}$ to $N^{th}$ stage shift registers comprises:
a pre-charge unit that is coupled to a first node of the $i^{th}$ stage shift register and is configured to receive a first input signal and output a pre-charge signal to the first node;
a pull-up unit that is coupled to the first node and a second node of the $i^{th}$ stage shift register and is configured to output an $i^{th}$ stage scan signal of the $1^{st}$ to $N^{th}$ stage scan signals to the second node;
a first pull-down unit that is coupled to the first node and the second node and is configured to receive a first pull-down control signal and a second pull-down control signal; and
a second pull-down unit that is coupled to the first node and the second node and is configured to receive the first pull-down control signal and the second pull-down control signal;
wherein i is an integer that is greater than or equal to 1 and is smaller than or equal to N, the first input signal received by the $1^{st}$ stage shift register switches from a low voltage level to a high voltage level at a first time point, and at least one of the first pull-down control signal and the second pull-down control signal switches from a disable voltage to an enable voltage before the display panel switches from a non-display status to a display status and before the first time point.

13. The gate driving circuit of claim 12, the first pull-down control signal and the second pull-down control signal are phase-inverted during a time duration before the display panel switches from the non-display status to the display status.

14. The gate driving circuit of claim 13, wherein the time duration is greater than or equal to 50 milliseconds and is less than or equal to 1 second.

15. A display panel having a display area and a non-display area, the display panel comprising:
a substrate;
a plurality of gate lines and a plurality of data lines disposed on the substrate, the plurality of gate lines having $1^{st}$ to $N^{th}$ gate lines, wherein N is an integer greater than 1; and
$1^{st}$ to $N^{th}$ stage shift registers that are disposed on the substrate and in the non-display area and are configured to respectively provide $1^{st}$ to $N^{th}$ stage scan signals to the $1^{st}$ to $N^{th}$ gate lines;
wherein an $i^{th}$ stage shift register of the $1^{st}$ to $N^{th}$ stage shift registers comprises:
a pre-charge unit that is coupled to a first node of the $i^{th}$ stage shift register and is configured to receive a first input signal and output a pre-charge signal to the first node;
a pull-up unit that is coupled to the first node and a second node of the $i^{th}$ stage shift register, and is configured to output an $i^{th}$ stage scan signal of the $1^{st}$ to $N^{th}$ stage scan signals to the second node; and
a pull-down unit that is coupled to the first node and the second node and is configured to receive a pull-down control signal;
wherein i is an integer that is greater than or equal to 1 and is smaller than or equal to N, the first input signal received by the $1^{st}$ stage shift register switches from a low voltage level to a high voltage level at a first time point, and the pull-down control signal switches from a disable voltage to an enable voltage before the display panel switches from a non-display status to a display status and before the first time point.

16. The display panel of claim 15, wherein the $1^{st}$ to $N^{th}$ stage shift registers are a gate driver on array (GOA).

17. The display panel of claim 15, wherein the $i^{th}$ stage shift register further comprises another pull-down unit; wherein:
the pull-down unit is configured to further receive another pull-down control signal; and
the another pull-down unit is coupled to the first node and the second node and is configured to receive the control signal and the another pull-down control signal.

18. The display panel of claim 17, wherein the pull-down control signal and the another pull-down control signal are phase inverted during a time duration before the display panel switches from the non-display status to the display status.

19. The display panel of claim 18, wherein the time duration is greater than or equal to 50 milliseconds and is less than or equal to 1 second.

* * * * *